US009916929B2

(12) United States Patent
Ando et al.

(10) Patent No.: US 9,916,929 B2
(45) Date of Patent: Mar. 13, 2018

(54) ELECTRONIC COMPONENT

(71) Applicant: TDK CORPORATION, Tokyo (JP)

(72) Inventors: Norihisa Ando, Tokyo (JP); Sunao Masuda, Tokyo (JP); Masahiro Mori, Tokyo (JP); Kayou Kusano, Nikaho (JP)

(73) Assignee: TDK CORPORATION, Tokyo (JP)

( * ) Notice: Subject to any disclaimer, the term of this patent is extended or adjusted under 35 U.S.C. 154(b) by 180 days.

(21) Appl. No.: 15/142,580

(22) Filed: Apr. 29, 2016

(65) Prior Publication Data

US 2016/0343504 A1 Nov. 24, 2016

(30) Foreign Application Priority Data

May 20, 2015 (JP) ................. 2015-103025

(51) Int. Cl.
| | |
|---|---|
| *H02H 9/00* | (2006.01) |
| *H01G 2/16* | (2006.01) |
| *H01G 2/14* | (2006.01) |
| *H01G 4/30* | (2006.01) |
| *H01G 4/232* | (2006.01) |
| *H01G 4/40* | (2006.01) |
| *H01G 2/06* | (2006.01) |
| *H05K 1/18* | (2006.01) |

(52) U.S. Cl.
CPC ............ *H01G 2/16* (2013.01); *H01G 2/065* (2013.01); *H01G 2/14* (2013.01); *H01G 4/232* (2013.01); *H01G 4/30* (2013.01); *H01G 4/40* (2013.01); *H05K 1/181* (2013.01); *H05K 2201/10015* (2013.01); *H05K 2201/10181* (2013.01); *H05K 2201/10515* (2013.01); *H05K 2201/10522* (2013.01); *Y02P 70/611* (2015.11)

(58) Field of Classification Search
CPC ...................................................... H01G 2/16
See application file for complete search history.

(56) References Cited

U.S. PATENT DOCUMENTS

| | | |
|---|---|---|
| 5,093,774 A | 3/1992 | Cobb |
| 6,574,089 B1 | 6/2003 | Moriwaki et al. |
| 7,164,573 B1 * | 1/2007 | Prymak .................... H01G 2/16 361/306.1 |
| 7,826,200 B2 * | 11/2010 | Pascenko ................. H01G 2/16 361/516 |
| 2005/0041367 A1 | 2/2005 | Yoshii et al. |

FOREIGN PATENT DOCUMENTS

| | | |
|---|---|---|
| CN | 1585055 A | 2/2005 |
| JP | 2000-235931 A | 8/2000 |

* cited by examiner

Primary Examiner — Stephen W Jackson
(74) Attorney, Agent, or Firm — Oliff PLC

(57) ABSTRACT

A first metal terminal includes a first connection portion connected to an electrode portion of a second external electrode, and a first leg portion extending from the first connection portion. A second metal terminal includes a second connection portion connected to a conductor portion of a connection conductor, and a second leg portion extending from the second connection portion. A multilayer capacitor and an overcurrent protection device are disposed in such a manner that a first principal surface and a third side surface oppose each other. An electrode portion of a first external electrode and an electrode portion of a fourth external electrode are connected to each other.

4 Claims, 13 Drawing Sheets

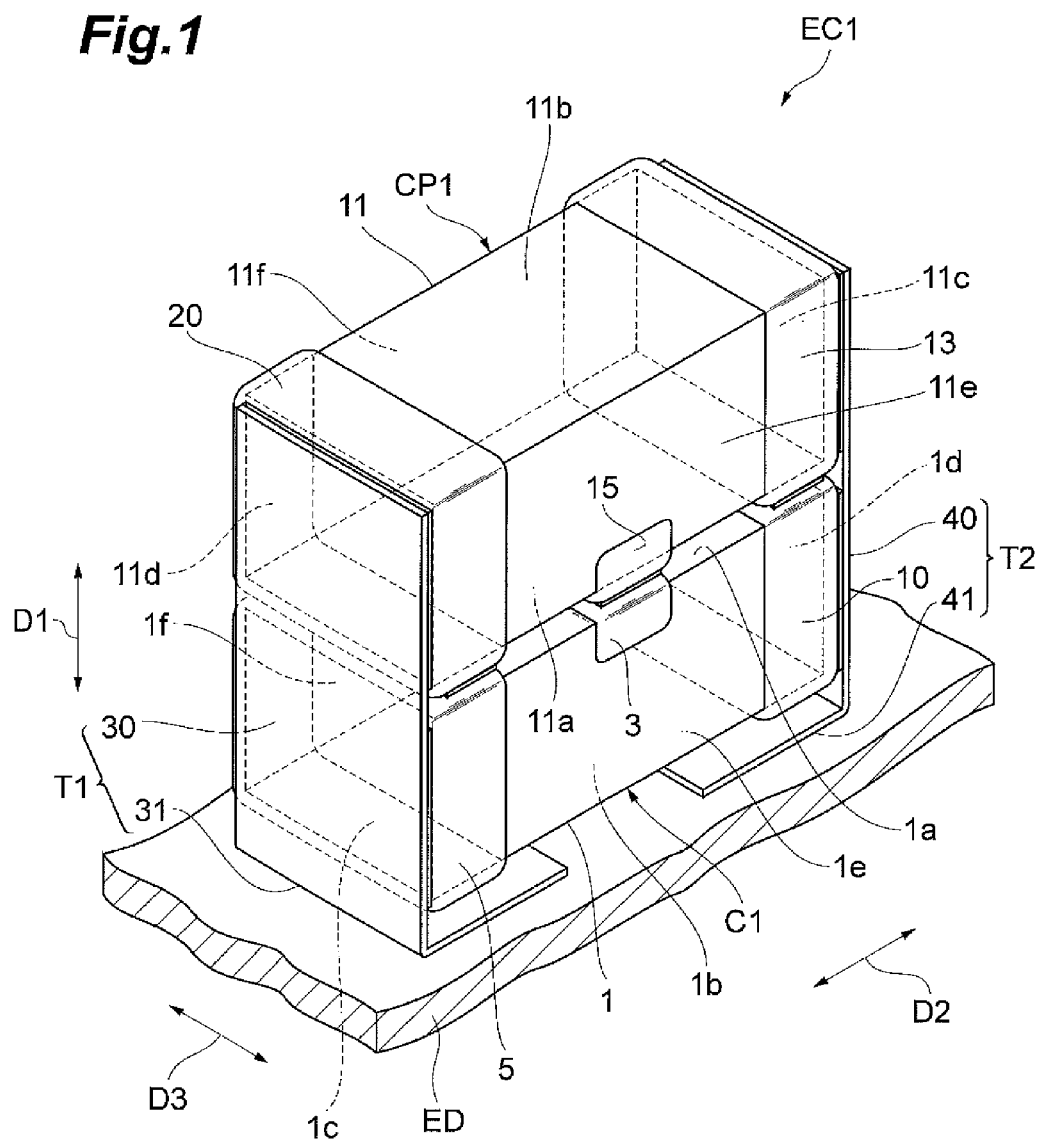

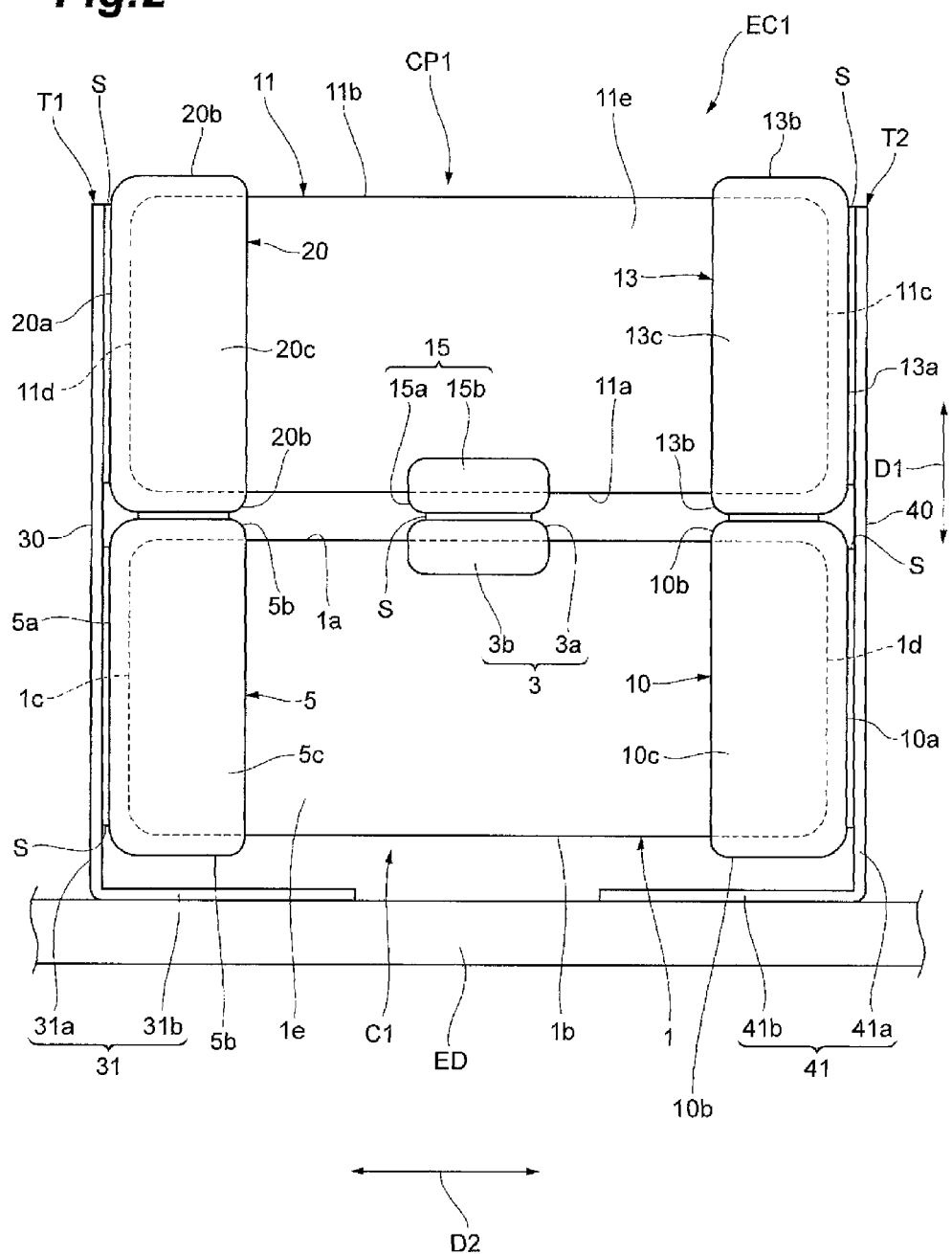

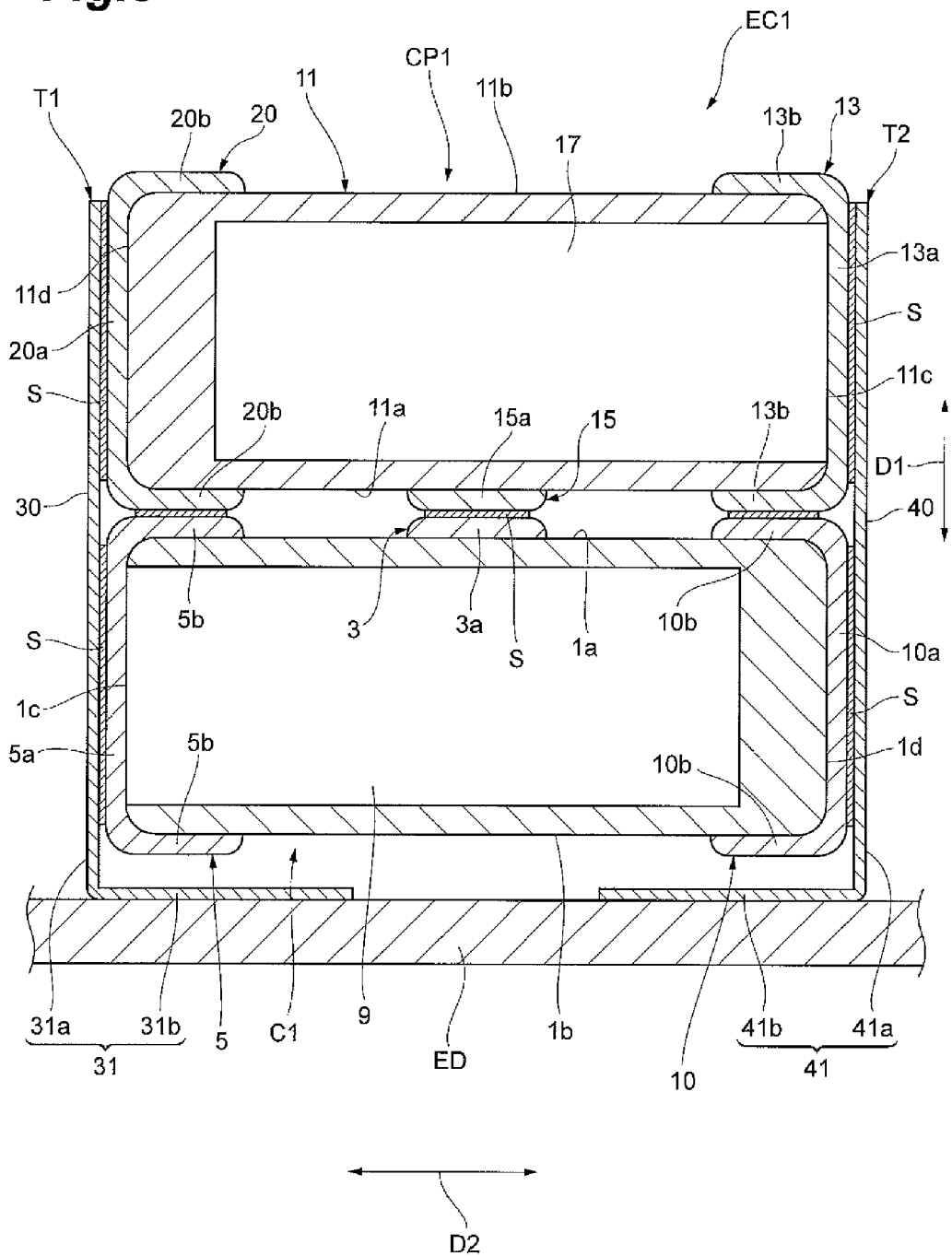

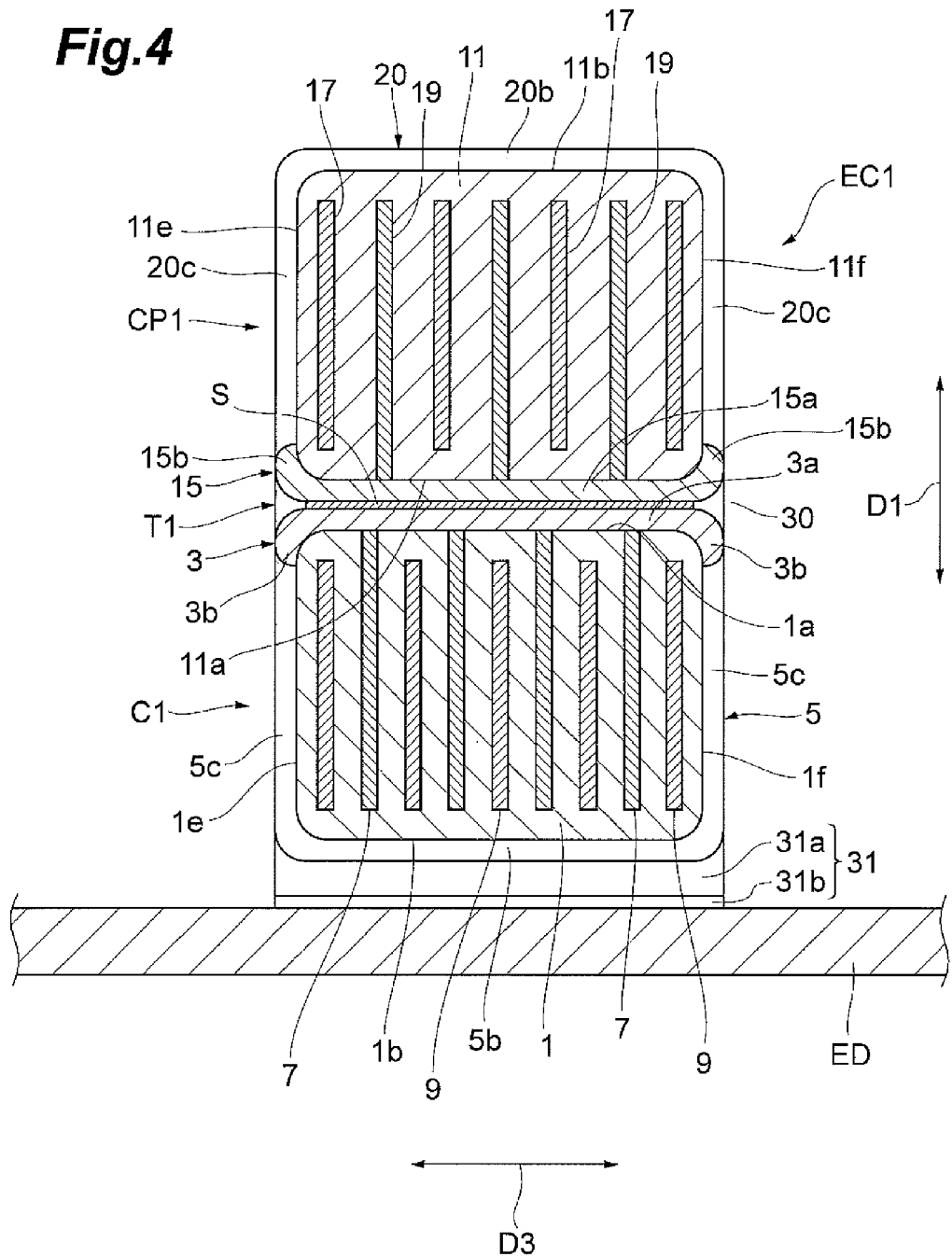

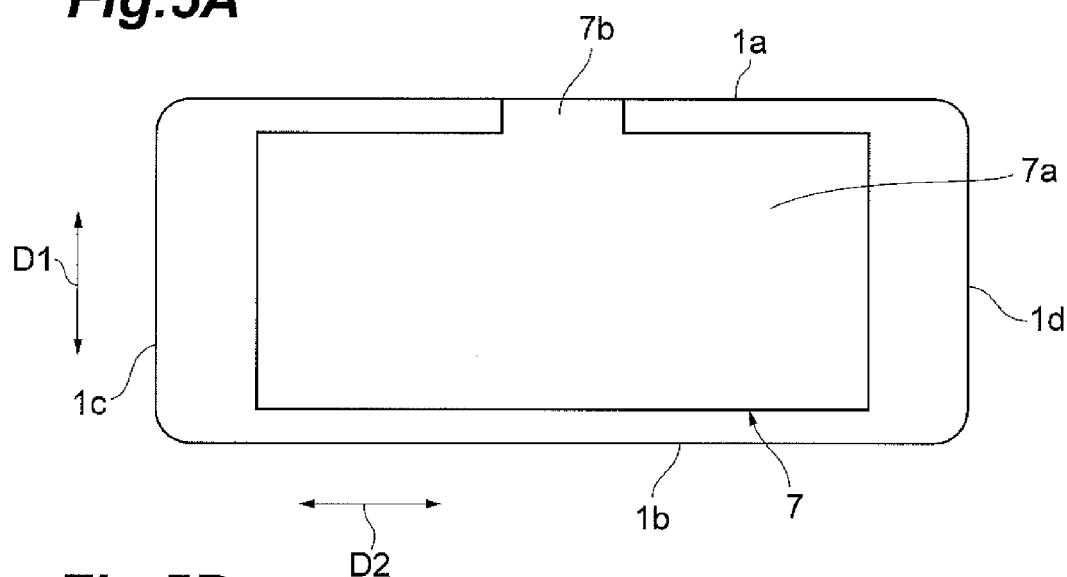
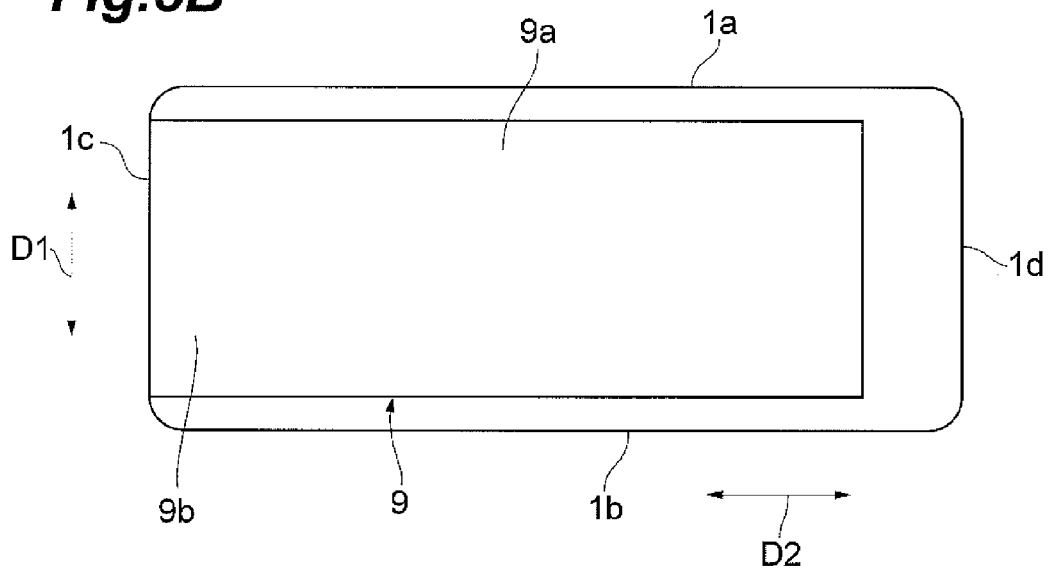

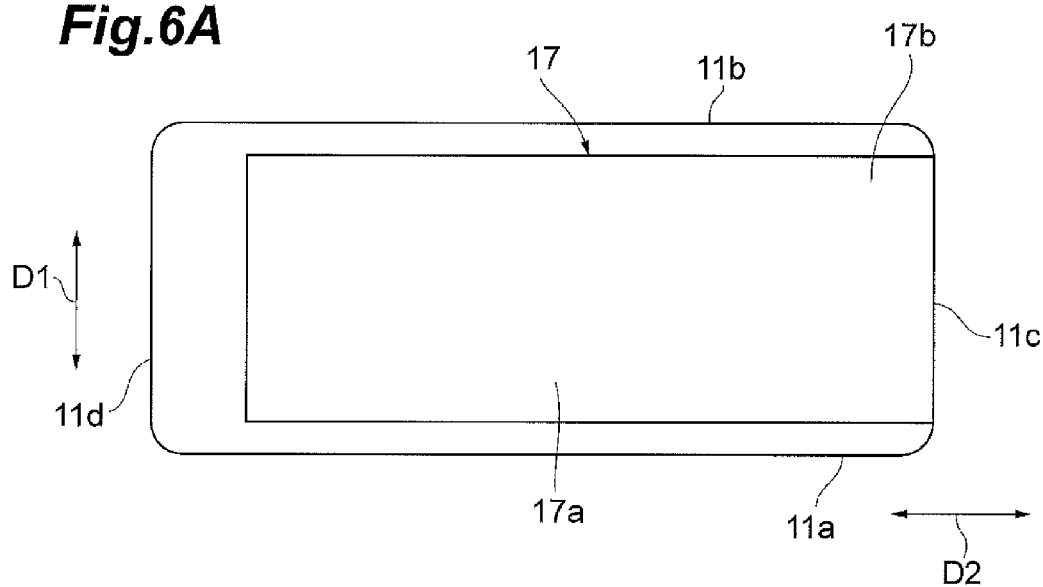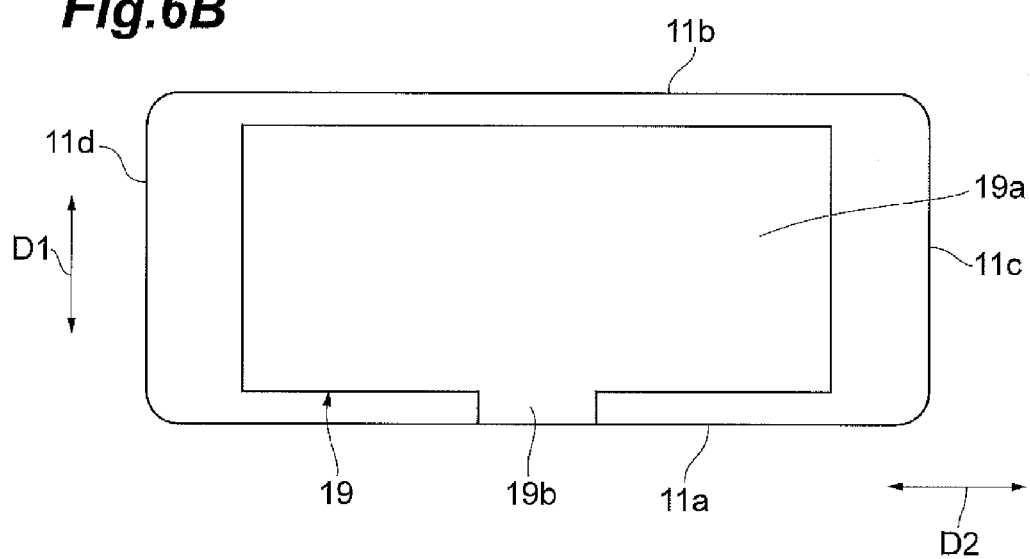

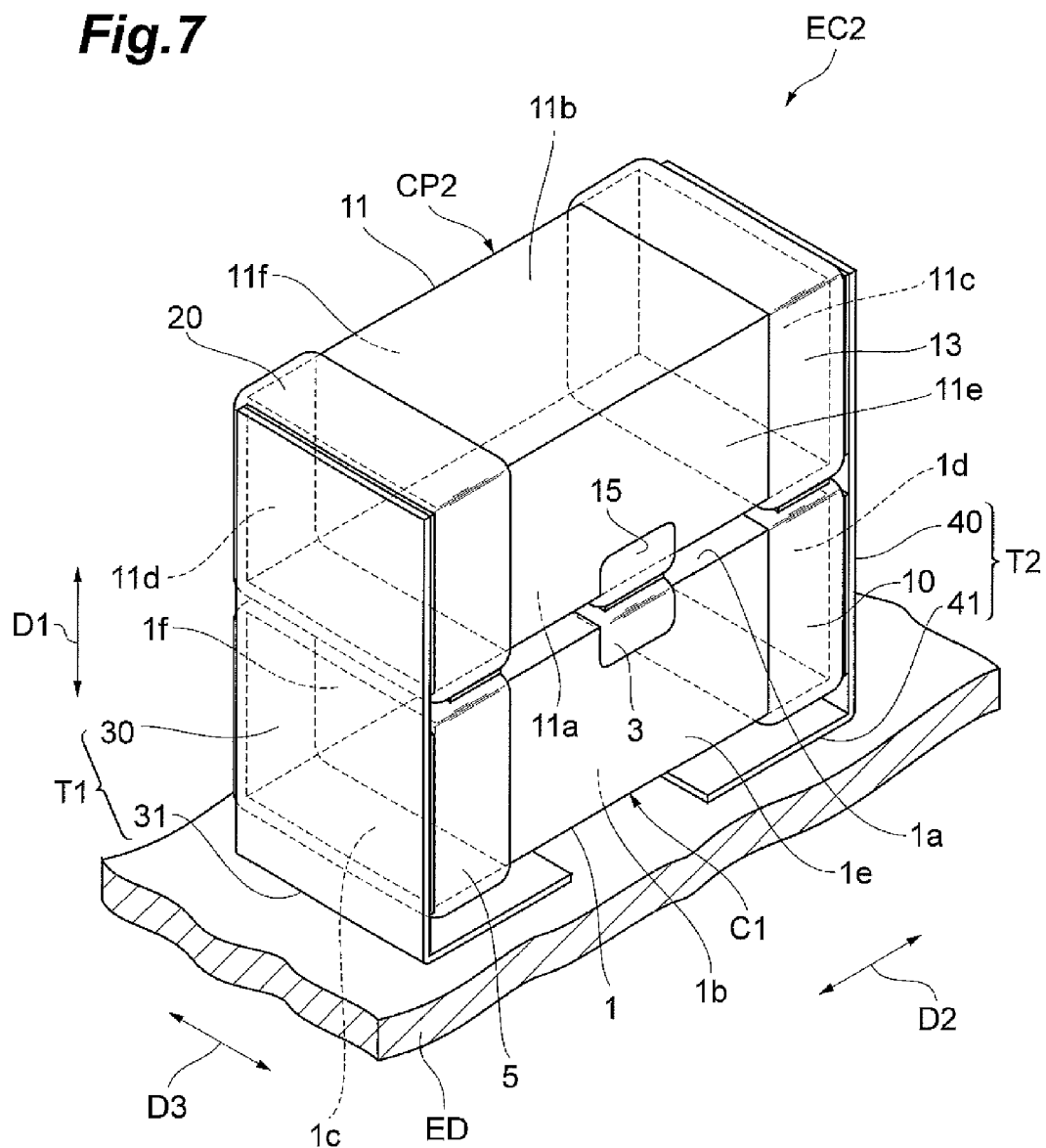

ELECTRONIC COMPONENT

TECHNICAL FIELD

The present invention relates to an electronic component.

BACKGROUND

Known electronic components include a multilayer capacitor and first and second metal terminals (e.g., cf. Japanese Unexamined Patent Publication No. 2000-235931). The multilayer capacitor includes an element body having a rectangular parallelepiped, first and second internal electrodes, and first and second external electrodes. The element body includes first and second end surfaces opposing each other. The first and second internal electrodes are disposed in the element body to oppose each other. The first external electrode is disposed on the first end surface, and connected to the first internal electrode. The second external electrode is disposed on the second end surface, and connected to the second internal electrode. The first external electrode and the first metal terminal are connected to each other. The second external electrode and the second metal terminal are connected to each other.

SUMMARY

In the electronic component described in Japanese Unexamined Patent Publication No. 2000-235931, if the multilayer capacitor short-circuits, overcurrent may flow.

The object of an aspect of the present invention is to provide an electronic component that prevents overcurrent flow even if a multilayer capacitor short-circuits.

An electronic component according to an aspect of the present invention includes a multilayer capacitor, an overcurrent protection device, a first metal terminal, and a second metal terminal. The multilayer capacitor includes a first element body having a rectangular parallelepiped shape, first and second internal electrodes, and first and second external electrodes. The first element body includes first and second principal surfaces opposing each other in a first direction, first and second end surfaces opposing each other in a second direction orthogonal to the first direction, and first and second side surfaces opposing each other in a third direction orthogonal to the first and second directions. The first and second internal electrodes are disposed in the first element body to oppose each other. The first external electrode includes an electrode portion disposed on the first principal surface, and the first internal electrode is connected to the first external electrode. The second external electrode includes an electrode portion disposed on the first end surface, and the second internal electrode is connected to the second external electrode. The overcurrent protection device includes a second element body, a protection circuit element, a third external electrode, and a fourth external electrode. The second element body includes third and fourth end surfaces opposing each other in the second direction, and a third side surface connecting the third and fourth end surfaces. The protection circuit element is disposed in the second element body. The third external electrode includes an electrode portion disposed on the third end surface, and the protection circuit element is connected to the third external electrode. The fourth external electrode includes an electrode portion disposed on the third side surface, and the protection circuit element is connected to the fourth external electrode. The first metal terminal includes a first connection portion connected to the electrode portion of the second external electrode, and a first leg portion extending from the first connection portion. The second metal terminal includes a second connection portion connected to the electrode portion of the third external electrode, and a second leg portion extending from the second connection portion. The multilayer capacitor and the overcurrent protection device are disposed in such a manner that the first principal surface and the third side surface oppose each other. The electrode portion of the first external electrode and the electrode portion of the fourth external electrode are connected to each other.

In the above-described electronic component according to the aspect, the first connection portion of the first metal terminal and the second external electrode of the multilayer capacitor are connected to each other. The second connection portion of the second metal terminal and the third external electrode of the overcurrent protection device are connected to each other. The first external electrode of the multilayer capacitor and the fourth external electrode of the overcurrent protection device are connected to each other. Thus, the multilayer capacitor and the overcurrent protection device are connected in series between the first and second metal terminals. As a result, even if the multilayer capacitor short-circuits, the overcurrent protection device prevents overcurrent from flowing between the first and second metal terminals.

The overcurrent protection device and the multilayer capacitor are disposed in such a manner that the third side surface opposes the first principal surface of the multilayer capacitor. The protection circuit element is disposed in the second element body. The third and fourth external electrodes are disposed on the second element body. If the protection circuit element is disposed on the second element body, the design flexibility related to the layout of the protection circuit element and the fourth external electrode (the electrode portion of the fourth external electrode) is low. In other words, since the electrode portion of the first external electrode of the multilayer capacitor is disposed on the first principal surface opposing the third side surface on which the electrode portion of the fourth external electrode is disposed, the protection circuit element needs to be disposed in a position where short circuit with the electrode portion of the first external electrode is avoided. In addition, since the protection circuit element and the fourth external electrode need to be connected to each other, the protection circuit element and the fourth external electrode cannot be freely laid out. Thus, in the above-described electronic component according to the aspect, since the protection circuit element is disposed in the second element body, the design flexibility related to the layout of the protection circuit element and the fourth external electrode is higher as compared with an electronic component employing a configuration in which the protection circuit element is disposed on the second element body.

When voltage is applied to the multilayer capacitor, mechanical strain arises in magnitude depending upon the applied voltage in the first element body due to an electrostrictive effect. The mechanical strain generates vibration of the multilayer capacitor (hereinafter, referred to as electrostrictive vibration). When the multilayer capacitor is mounted to an electronic device (e.g., circuit board, another electronic component, or the like), and voltage is applied to the multilayer capacitor, electrostrictive vibration propagates to the electronic device. If the electrostrictive vibration propagates to the electronic device, the electronic device may vibrate, and vibration sound may be generated.

In the above-described electronic component according to the aspect, since the first metal terminal includes the first leg portion, and the second metal terminal includes the second leg portion, the first and second leg portions absorb the electrostrictive vibration. Thus, in the above-described electronic component according to the aspect, the propagation of electrostrictive vibration to an electronic device is suppressed. The generation of vibration sound is accordingly suppressed in the electronic device.

The first internal electrode and the electrode portion of the first external electrode may be connected to each other, and the protection circuit element and the electrode portion of the fourth external electrode may be connected to each other. In this case, the connection resistance between the multilayer capacitor and the overcurrent protection device is low. Thus, there is no possibility of disturbing the function of the overcurrent protection device (protection circuit element). As a result, overcurrent is prevented more surely from flowing between the first and second metal terminals.

The overcurrent protection device may be a PTC thermistor, and may include at least one pair of internal electrodes opposing each other, as the protection circuit element. In this case, one of the internal electrodes is connected to the third external electrode, and another one of the internal electrodes is connected to the fourth external electrode. In this configuration, if the short circuit of the multilayer capacitor causes overcurrent to flow between the first and second metal terminals, resistance between the one pair of internal electrodes of the PTC thermistor becomes higher. Thus, current is less likely to flow between the first and second metal terminals.

The overcurrent protection device may be a fuse, and may include an inner conductor made of soluble metal, as the protection circuit element. In this case, one end portion of the inner conductor is connected to the third external electrode, and another end portion of the inner conductor is connected to the fourth external electrode. In this configuration, if the short circuit of the multilayer capacitor causes overcurrent to flow between the first and second metal terminals, the inner conductor melts down. Thus, current does not flow between the first and second metal terminals.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 is a perspective view illustrating an electronic component according to an embodiment;

FIG. 2 is a side view illustrating the electronic component according to the present embodiment;

FIG. 3 is a diagram for illustrating a cross-sectional configuration of the electronic component according to the present embodiment;

FIG. 4 is a diagram for illustrating a cross-sectional configuration of the electronic component according to the present embodiment;

FIG. 5A is a plan view illustrating a first internal electrode, and FIG. 5B is a plan view illustrating a second internal electrode;

FIG. 6A is a plan view illustrating a third internal electrode, and FIG. 6B is a plan view illustrating a fourth internal electrode;

FIG. 7 is a perspective view illustrating an electronic component according to a modified example of the embodiment;

DETAILED DESCRIPTION

Figure 8:
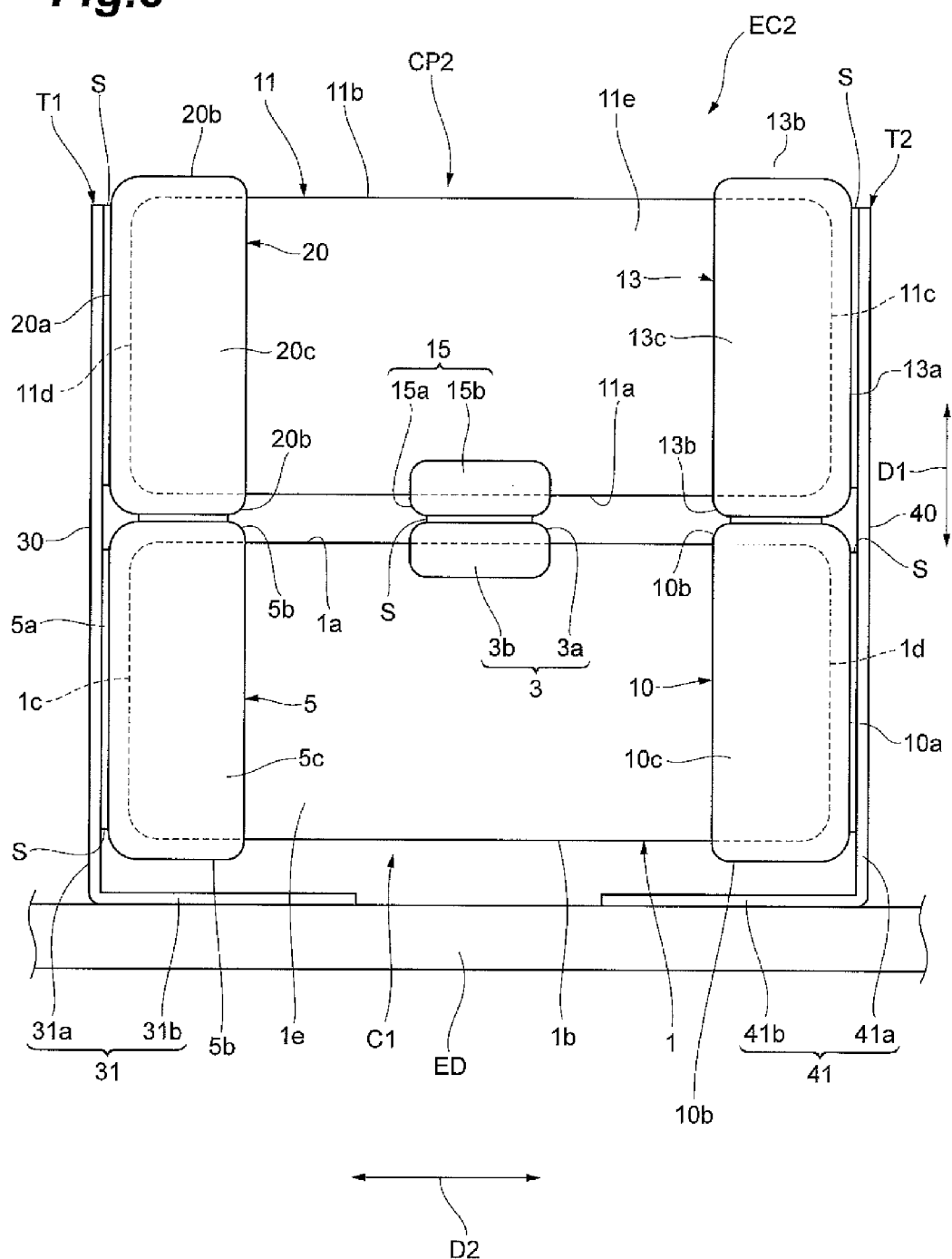
FIG. 8 is a side view illustrating the electronic component according to the modified example.

Hereinafter, an embodiment of the present invention will be described in detail with reference to the attached drawings. In the following description, the same elements or elements having the same function are assigned the same reference numeral, and the redundant description will be omitted.

The configuration of an electronic component EC1 according to the present embodiment will be described hereinafter with reference to FIGS. 1 to 4. FIG. 1 is a perspective view illustrating the electronic component according to the present embodiment. FIG. 2 is a side view illustrating the electronic component according to the present embodiment. FIGS. 3 and 4 are diagrams for illustrating cross-sectional configurations of the electronic component according to the present embodiment.

As illustrated in FIGS. 1 and 2, the electronic component EC1 includes a multilayer capacitor C1, an overcurrent protection device CP1, a first metal terminal T1, and a second metal terminal T2.

As illustrated in FIGS. 3 and 4, the multilayer capacitor C1 includes a first element body 1 having a rectangular parallelepiped shape, and a first external electrode 3 and a second external electrode 5 that are disposed on the outer surfaces of the first element body 1. The first external electrode 3 and the second external electrode 5 are separated from each other. The rectangular parallelepiped shape includes a shape of a rectangular parallelepiped with chamfered corner portions and ridge line portions, and a shape of a rectangular parallelepiped with rounded corner portions and ridge line portions.

The first element body 1 includes first and second principal surfaces 1a and 1b opposing each other and each having a rectangular shape, first and second end surfaces 1c and 1d opposing each other, and first and second side surfaces 1e and 1f opposing each other. The first and second principal surfaces 1a and 1b, the first and second end surfaces 1c and 1d, and the first and second side surfaces 1e and 1f constitute the outer surfaces of the first element body 1. The direction in which the first and second principal surfaces 1a and 1b oppose each other corresponds to a first direction D1. The direction in which the first and second end surfaces 1c and 1d oppose each other corresponds to a second direction D2. The direction in which the first and second side surfaces 1e and 1f oppose each other corresponds to a third direction D3. The second direction D2 is orthogonal to the first direction D1. The third direction D3 is orthogonal to the first direction D1 and the second direction D2.

The first and second end surfaces 1c and 1d extend in the first direction D1 to connect between the first and second principal surfaces 1a and 1b. The first and second end surfaces 1c and 1d extend also in the third direction D3 (the short side direction of the first and second principal surfaces 1a and 1b). The first and second side surfaces 1e and 1f extend in the first direction D1 to connect between the first and second principal surfaces 1a and 1b. The first and second side surfaces 1e and 1f extend also in the second direction D2 (the long side direction of the first and second principal surfaces 1a and 1b). The first and second principal surfaces 1a and 1b and the first and second side surfaces 1e and 1f connect the first and second end surfaces 1c and 1d to each other.

The first element body 1 includes a plurality of dielectric layers stacked in a direction in which the first and second side surfaces 1e and if oppose each other (the third direction D3). In the first element body 1, the stacking direction of the plurality of dielectric layers corresponds to the third direction D3. Each dielectric layer includes a sintered body of a ceramic green sheet containing, for example, dielectric material (BaTiO3-based, Ba(Ti,Zr) O3-based, or (Ba, Ca) TiO3-based dielectric ceramics, or the like). In the actual first element body 1, the dielectric layers are so integrated that no boundary can be visually recognized between the dielectric layers.

As illustrated in FIGS. 3 and 4, the multilayer capacitor C1 includes a plurality of first internal electrodes 7 and a plurality of second internal electrodes 9. The first and second internal electrodes 7 and 9 are made of electrically-conductive material (e.g., Ni, Cu, or the like) generally used for internal electrodes of a multilayered electric element. The first and second internal electrodes 7 and 9 include a sintered body of electrically-conductive paste. The electrically-conductive paste contains the above-described electrically-conductive material.

The first internal electrodes 7 and the second internal electrodes 9 are disposed in positions (layers) different in the third direction D3. More specifically, the first internal electrodes 7 and the second internal electrodes 9 are alternately arranged in the first element body 1 to oppose each another with intervals in the third direction D3. The first internal electrodes 7 and the second internal electrodes 9 have polarities different from each other.

As illustrated in FIG. 5A, each of the first internal electrodes 7 includes a main electrode portion 7a and a connection portion 7b. The main electrode portion 7a has a rectangular shape with a long side direction corresponding to the second direction D2 and a short side direction corresponding to the first direction D1. The connection portion 7b extends from one side (one long side) of the main electrode portion 7a, and is exposed to the first principal surface 1a. In other words, the connection portion 7b extends from an end portion on the first principal surface 1a side of the main electrode portion 7a to the first principal surface 1a.

The first internal electrode 7 extends in a direction orthogonal to the first principal surface 1a (the first direction D1). The first internal electrode 7 exposes to the first principal surface 1a, and not exposed to the second principal surface 1b, the first and second end surfaces 1c and 1d, and the first and second side surfaces 1e and 1f. The connection portion 7b is connected to the first external electrode 3 at the end portion exposed to the first principal surface 1a. The main electrode portion 7a and the connection portion 7b are integrally formed.

As illustrated in FIG. 5B, each of the second internal electrodes 9 includes a main electrode portion 9a and a connection portion 9b. The main electrode portion 9a has a rectangular shape with a long side direction corresponding to the second direction D2 and a short side direction corresponding to the first direction D1. The connection portion 9b extends from one side (one short side) of the main electrode portion 9a, and is exposed to the first end surface 1c. In other words, the connection portion 9b extends from an end portion on the first end surface 1c side of the main electrode portion 9a to the first end surface 1c.

The second internal electrode 9 extends in a direction orthogonal to the first end surface 1c (the second direction D2). The second internal electrode 9 exposes to the first end surface 1c, and not exposed to the first and second principal surfaces 1a and 1b, the second end surface 1d, and the first and second side surfaces 1e and 1f. The connection portion 9b is connected to the second external electrode 5 at the end portion exposed to the first end surface 1c. The main electrode portion 9a and the connection portion 9b are integrally formed.

The first external electrode 3 is positioned at a center portion in the first direction D1 in the first element body 1. The first external electrode 3 includes an electrode portion 3a disposed on the first principal surface 1a and electrode portions 3b disposed on the first and second side surfaces 1e and 1f. In other words, the first external electrode 3 is formed on the three surfaces 1a, 1e, and 1f. The electrode portions 3a and 3b adjacent to each other are electrically connected to each other at a ridge line portion of the first element body 1.

The electrode portion 3a thoroughly covers a portion of each of the connection portions 7b that is exposed to the first principal surface 1a. The connection portion 7b is directly connected to the first external electrode 3 (the electrode portion 3a). In other words, the connection portion 7b connects the main electrode portion 7a and the electrode portion 3a to each other. Each of the first internal electrodes 7 is electrically connected to the first external electrode 3.

The second external electrode 5 is positioned at an end portion on the first end surface 1c side in the first element body 1. The second external electrode 5 includes an electrode portion 5a disposed on the first end surface 1c, electrode portions 5b disposed on the first and second principal surfaces 1a and 1b, and electrode portions 5c disposed on the first and second side surfaces 1e and 1f. In other words, the second external electrode 5 is formed on the five surfaces 1a, 1b, 1c, 1e, and 1f. The electrode portions 5a, 5b, and 5c adjacent to one another are electrically connected to one another at ridge line portions of the first element body 1.

The electrode portion 5a thoroughly covers a portion of each of the connection portions 9b that is exposed to the first end surface 1c. The connection portion 9b is directly connected to the second external electrode 5 (the electrode portion 5a). In other words, the connection portion 9b connects the main electrode portion 9a and the electrode portion 5a to each other. Each of the second internal electrodes 9 is electrically connected to the second external electrode 5.

The first and second external electrodes 3 and 5 include sintered conductor layers (sintered metal layers). The sintered conductor layer is formed by, for example, applying electrically-conductive paste to the outer surface of the first element body 1, and sintering the applied electrically-conductive paste. The electrically-conductive paste contains, for example, electrically-conductive metal powder and glass frit. The first and second external electrodes 3 and 5 may include plated layers formed on the sintered conductor layers.

The multilayer capacitor C1 includes a connection conductor 10. The connection conductor 10 is positioned at an end portion on the second end surface 1d side in the first element body 1. The connection conductor 10 includes a conductor portion 10a disposed on the second end surface 1d, conductor portions 10b disposed on the first and second principal surfaces 1a and 1b, and conductor portions 10c disposed on the first and second side surfaces 1e and 1f. In other words, the connection conductor 10 is formed on the five surfaces 1a, 1b, 1c, 1e, and 1f. The conductor portions 10a, 10b, and 10c adjacent to one another are connected to one another at ridge line portions of the first element body 1. The connection conductor 10 is not electrically connected to the first and second internal electrodes 7 and 9. The connection conductor 10 also includes the sintered conductor layer similarly to the first and second external electrodes 3 and 5. The connection conductor 10 may include a plated layer formed on the sintered conductor layer.

As illustrated in FIGS. 3 and 4, the overcurrent protection device CP1 includes a second element body 11 having a rectangular parallelepiped shape, and a third external electrode 13 and a fourth external electrode 15 that are disposed on the outer surfaces of the second element body 11. The third external electrode 13 and the fourth external electrode 15 are separated from each other. In the present embodiment, the overcurrent protection device CP1 is a PTC thermistor.

The second element body 11 includes third and fourth side surfaces 11a and 11b opposing each other and each having a rectangular shape, third and fourth end surfaces 11c and 11d opposing each other, and fifth and sixth side surfaces 11e and 11f opposing each other. The third and fourth side surfaces 11a and 11b, the third and fourth end surfaces 11c and 11d, and the fifth and sixth side surfaces 11e and 11f constitute the outer surfaces of the second element body 11. The direction in which the third and fourth side surfaces 11a and 11b oppose each other corresponds to the first direction D1. The direction in which the third and fourth end surfaces 11c and 11d oppose each other corresponds to a second direction D2. The direction in which the fifth and sixth side surfaces 11e and 11f oppose each other corresponds to the third direction D3.

The third and fourth end surfaces 11c and 11d extend in the first direction D1 to connect between the third and fourth side surfaces 11a and 11b. The third and fourth end surfaces 11c and 11d extend also in the third direction D3. The third and fourth side surfaces 11a and 11b extend in the second direction D2 to connect between the third and fourth end surfaces 11c and 11d. The fifth and sixth side surfaces 11e and 11f extend in the first direction D1 to connect between the third and fourth side surfaces 11a and 11b. The fifth and sixth side surfaces 11e and 11f extend also in the second direction D2. The third, fourth, fifth, and sixth side surfaces 11a, 11b, 11e, and 11f connect the third and fourth end surfaces 11c and 11d to each other.

The length in the second direction D2 of the second element body 11 is equivalent to the length in the second direction D2 of the first element body 1. In the present embodiment, the length in the third direction D3 of the second element body 11 is equivalent to the length in the third direction D3 of the first element body 1, and the length in the first direction D1 of the second element body 11 is equivalent to the length in the first direction D1 of the first element body 1. The length in the second direction D2 of the second element body 11 may be different from the length in the second direction D2 of the first element body 1. The length in the third direction D3 of the second element body 11 may be different from the length in the third direction D3 of the first element body 1. The length in the first direction D1 of the second element body 11 may be different from the length in the first direction D1 of the first element body 1. The "equivalent" is not necessarily limited to an identical value. Even if a value contains a minute error within a preset range, a manufacturing error, or the like, the value may be regarded as equivalent.

The second element body 11 includes a plurality of semiconductor layers stacked in a direction in which the fifth and sixth side surfaces 11e and 11f oppose each other (the third direction D3). In the second element body 11, the stacking direction of the plurality of semiconductor layers corresponds to the third direction D3. Each semiconductor layer includes a sintered body of a ceramic green sheet containing semiconductor material (e.g., BaTiO3-based semiconductor ceramics or the like). In the actual second element body 11, the semiconductor layers are so integrated that no boundary can be visually recognized between the semiconductor layers.

The overcurrent protection device CP1 includes a protection circuit element disposed in the second element body 11. In the present embodiment, as illustrated in FIGS. 3 and 4, the overcurrent protection device CP1 includes a plurality of third internal electrodes 17 and a plurality of fourth internal electrodes 19. The plurality of third internal electrodes 17 and the plurality of fourth internal electrodes 19 constitute a protection circuit element. The third and fourth internal electrodes 17 and 19 are made of electrically-conductive material (e.g., Ni, Cu, or the like) generally used for internal electrodes of a multilayered electric element. The third and fourth internal electrodes 17 and 19 include a sintered body of electrically-conductive paste. The electrically-conductive paste contains the above-described electrically-conductive material.

The third internal electrodes 17 and the fourth internal electrodes 19 are disposed in positions (layers) different in the third direction D3. More specifically, the third internal electrodes 17 and the fourth internal electrodes 19 are alternately arranged in the second element body 11 to oppose each another with intervals in the third direction D3. The overcurrent protection device CP1 includes at least one pair of internal electrodes 17 and 19 opposing each other.

As illustrated in FIG. 6A, each of the third internal electrodes 17 includes a main electrode portion 17a and a connection portion 17b. The main electrode portion 17a has a rectangular shape with a long side direction corresponding to the second direction D2 and a short side direction corresponding to the first direction D1. The connection portion 17b extends from one side (one short side) of the main electrode portion 17a, and is exposed to the third end surface 11c. In other words, the connection portion 17b extends from an end portion on the third end surface 11c side of the main electrode portion 17a to the third end surface 11c.

The third internal electrode 17 extends in a direction orthogonal to the third end surface 11c (the second direction D2). The third internal electrode 17 is exposed to the third end surface 11c, and not exposed to the fourth end surface 11d, and the third, fourth, fifth, and sixth side surfaces 11a, 11b, 11e, and 11f. The connection portion 17b is connected to the third external electrode 13 at the end portion exposed to the third end surface 11c. The third internal electrode 17 extends in a direction orthogonal to the third side surface 11a (the first direction D1). The main electrode portion 17a and the connection portion 17b are integrally formed.

As illustrated in FIG. 6B, each of the fourth internal electrodes 19 includes a main electrode portion 19a and a connection portion 19b. The main electrode portion 19a has a rectangular shape with a long side direction corresponding to the second direction D2 and a short side direction corresponding to the first direction D1. The connection portion 19b extends from one side (one long side) of the main electrode portion 19a, and is exposed to the third side surface 11a. In other words, the connection portion 19b extends from an end portion on the third side surface 11a side of the main electrode portion 19a to the third side surface 11a.

The fourth internal electrode 19 extends in a direction orthogonal to the third side surface 11a (the first direction D1). The fourth internal electrode 19 is exposed to the third side surface 11a, and not exposed to the third and fourth end surfaces 11c and 11d, and the fourth, fifth, and sixth side surfaces 11b, 11e, and 11f. The connection portion 19b is connected to the fourth external electrode 15 at the end portion exposed to the third side surface 11a. The main electrode portion 19a and the connection portion 19b are integrally formed.

The third external electrode 13 is positioned at an end portion on the third end surface 11c side in the second element body 11. The third external electrode 13 includes an electrode portion 13a disposed on the third end surface 11c, electrode portions 13b disposed on the third and fourth side surfaces 11a and 11b, and electrode portions 13c disposed on the fifth and sixth side surfaces 11e and 11f. In other words, the third external electrode 13 is formed on the five surfaces 11a, 11b, 11c, 11e, and 11f. The electrode portions 13a, 13b, and 13c adjacent to one another are electrically connected to one another at ridge line portions of the second element body 11.

The electrode portion 13a thoroughly covers a portion of each of the connection portions 17b that is exposed to the third end surface 11c. The connection portion 17b is directly connected to the third external electrode 13 (the electrode portion 13a). In other words, the connection portion 17b connects the main electrode portion 17a and the electrode portion 13a to each other. Each of the third internal electrodes 17 is electrically connected to the third external electrode 13.

The fourth external electrode 15 is positioned at a center portion in the second direction D2 in the second element body 11. The fourth external electrode 15 includes an electrode portion 15a disposed on the third side surface 11a and electrode portions 15b disposed on the fifth and sixth side surfaces 11e and 11f. In other words, the fourth external electrode 15 is formed on the three surfaces 11a, 11e, and 11f. The electrode portions 15a and 15b adjacent to each other are electrically connected to each other at an edge line portion of the second element body 11.

The electrode portion 15a thoroughly covers a portion of each of the connection portions 19b that is exposed to the third side surface 11a. The connection portion 19b is directly connected to the fourth external electrode 15 (the electrode portion 15a). In other words, the connection portion 19b connects the main electrode portion 19a and the electrode portion 15a to each other. Each of the fourth internal electrodes 19 is electrically connected to the fourth external electrode 15.

The third and fourth external electrodes 13 and 15 also include sintered conductor layers similarly to the first and second external electrodes 3 and 5. The sintered conductor layer is formed by, for example, applying electrically-conductive paste to the outer surface of the second element body 11, and sintering the applied electrically-conductive paste. The electrically-conductive paste contains, for example, electrically-conductive metal powder and glass frit. The third and fourth external electrodes 13 and 15 may include plated layers formed on the sintered conductor layers.

The overcurrent protection device CP1 includes a connection conductor 20. The connection conductor 20 is positioned at an end portion on the fourth end surface 11d side in the second element body 11. The connection conductor 20 includes a conductor portion 20a disposed on the fourth end surface 11d, conductor portions 20b disposed on the third and fourth side surfaces 11a and 11b, and conductor portions 20c disposed on the fifth and sixth side surfaces 11e and 11f. In other words, the connection conductor 20 is formed on the five surfaces 11a, 11b, 11c, 11e, and 11f. The conductor portions 20a, 20b, and 20c adjacent to one another are connected to one another at edge line portions of the second element body 11. The connection conductor 20 is not electrically connected to the third and fourth internal electrodes 17 and 19. The connection conductor 20 also includes the sintered conductor layer similarly to the third and fourth external electrodes 13 and 15. The connection conductor 20 may include a plated layer formed on the sintered conductor layer.

The first metal terminal T1 is disposed to oppose the first end surface 1c of the multilayer capacitor C1 (the first element body 1) and the fourth end surface 11d of the overcurrent protection device CP1 (the second element body 11). The first metal terminal T1 is connected to the second external electrode 5 and the connection conductor 20. The first metal terminal T1 is electrically connected to the second internal electrodes 9 through the second external electrode 5. The first metal terminal T1, and the second external electrode 5 and the connection conductor 20 are connected to each other by, for example, a solder S.

The first metal terminal T1 includes a first connection portion 30 and a first leg portion 31. The first connection portion 30 opposes the first and fourth end surfaces 1c and 11d. The electrode portion 5a of the second external electrode 5 and the conductor portion 20a of the connection conductor 20 are connected to the first connection portion 30. The first connection portion 30 extends in the first direction D1, and has a rectangular shape when viewed from the second direction D2.

The first leg portion 31 extends from one end of the first connection portion 30. The first leg portion 31 includes a first portion 31a and a second portion 31b. The first portion 31a extends in the first direction D1 from one end of the first connection portion 30. In other words, the first portion 31a extends in the same direction as the first connection portion 30 (the first direction D1), and the first connection portion 30 and the first portion 31a are positioned on the same plane.

The second portion 31b extends in the second direction D2 from one end of the first portion 31a, and has a rectangular shape when viewed from the first direction D1. The first portion 31a and the second portion 31b extend in the respective directions intersecting with each other. In the present embodiment, the first portion 31a and the second portion 31b extend in the respective directions orthogonal to each other. The second portion 31b is connected to an electronic device ED (e.g., circuit board, electronic component, or the like).

The first portion 31a connects the first connection portion 30 and the second portion 31b to each other. In other words, the first portion 31a extends in the first direction D1 to connect one end of the first connection portion 30 and one end of the second portion 31b to each other. When viewed in the first direction D1, the first connection portion 30 and the second portion 31b are separated from each other by the length of the first portion 31a. The first connection portion 30 and the first leg portion 31 (the first and second portions 31a and 31b) are integrally formed. The first metal terminal T1 is made of, for example, metal material (Fe—Ni alloy, etc.).

The second metal terminal T2 is disposed to oppose the second end surface 1d of the multilayer capacitor C1 (the first element body 1) and the third end surface 11c of the overcurrent protection device CP1 (the second element body 11). The second metal terminal T2 opposes the first metal terminal T1 in such a manner as to sandwich the multilayer capacitor C1 and the overcurrent protection device CP1 between the second metal terminal T2 and the first metal terminal T1. The second metal terminal T2 is connected to the third external electrode 13 and the connection conductor 10. The second metal terminal T2 is electrically connected to the third internal electrodes 17 through the third external electrode 13. The second metal terminal T2, and the third external electrode 13 and the connection conductor 10 are connected to each other by, for example, the solder S.

The second metal terminal T2 includes a second connection portion 40 and a second leg portion 41. The second connection portion 40 opposes the second and third end surfaces 1d and 11c. The electrode portion 13a of the third external electrode 13 and the conductor portion 10a of the connection conductor 10 are connected to the second connection portion 40. The second connection portion 40 extends in the first direction D1, and has a rectangular shape when viewed from the second direction D2.

The second leg portion 41 extends from one end of the second connection portion 40. The second leg portion 41 includes a third portion 41a and a fourth portion 41b. The third portion 41a extends in the first direction D1 from one end of the second connection portion 40. In other words, the third portion 41a extends in the same direction as the second connection portion 40 (the first direction D1), and the second connection portion 40 and the third portion 41a are positioned on the substantially same plane.

The fourth portion 41b extends in the second direction D2 from one end of the third portion 41a, and has a rectangular shape when viewed from the first direction D1. The third portion 41a and the fourth portion 41b extend in the respective directions intersecting with each other. In the present embodiment, the third portion 41a and the fourth portion 41b extend in the respective directions orthogonal to each other. The fourth portion 41b is connected to the electronic device ED. The fourth portion 41b and the second portion 31b are positioned on the substantially same plane.

The third portion 41a connects the second connection portion 40 and the fourth portion 41b to each other. In other words, the third portion 41a extends in the first direction D1 to connect one end of the second connection portion 40 and one end of the fourth portion 41b to each other. When viewed in the first direction D1, the second connection portion 40 and the fourth portion 41b are separated from each other by the length of the third portion 41a. The second connection portion 40 and the second leg portion 41 (the third and fourth portions 41a and 41b) are integrally formed. The second metal terminal T2 is made of, for example, metal material (Fe—Ni alloy, etc.).

In the electronic component EC1, the multilayer capacitor C1 and the overcurrent protection device CP1 are disposed in such a manner that the first principal surface 1a and the third side surface 11a oppose each other. In other words, the multilayer capacitor C1 and the overcurrent protection device CP1 are arranged next to each other in the first direction D1. The electrode portion 3a disposed on the first principal surface 1a and the electrode portion 15a disposed on the third side surface 11a are connected to each other. The electrode portions 3a and 15a are connected to each other by, for example, the solder S. The multilayer capacitor C1 and the overcurrent protection device CP1 are adjacent to each other in the first direction D1.

The electronic component EC1 is mounted on the electronic device ED in a state in which the second principal surface 1b of the multilayer capacitor C1 opposes the electronic device ED. In other words, the electronic component EC1 is mounted in such a manner that the first direction D1 intersects with the electronic device ED. For example, the electronic component EC1 is solder-mounted on the electronic device ED. The first and second metal terminals T1 and T2 are connected to a land electrode (not illustrated) formed on the electronic device ED. The land electrode is connected to, for example, a signal line (not illustrated) formed on the electronic device ED.

In a state in which the electronic component EC1 is mounted on the electronic device ED, the multilayer capacitor C1 is separated from the electronic device ED in the first direction D1. The multilayer capacitor C1 is positioned between the overcurrent protection device CP1 and the electronic device ED.

As described above, in the present embodiment, the first connection portion 30 of the first metal terminal T1 and the second external electrode 5 of the multilayer capacitor C1 are connected to each other. The second connection portion 40 of the second metal terminal T2 and the third external electrode 13 of the overcurrent protection device CP1 are connected to each other. The first external electrode 3 of the multilayer capacitor C1 and the fourth external electrode 15 of the overcurrent protection device CP1 are connected to each other. Thus, the multilayer capacitor C1 and the overcurrent protection device CP1 are connected in series between the first and second metal terminals T1 and T2. As a result, even if the multilayer capacitor C1 short-circuits, the overcurrent protection device CP1 prevents overcurrent from flowing between the first and second metal terminals T1 and T2.

The overcurrent protection device CP1 and the multilayer capacitor C1 are disposed in such a manner that the third side surface 11a opposes the first principal surface 1a of the multilayer capacitor C1. The protection circuit element (the third and fourth internal electrodes 17 and 19) is disposed in the second element body 11. The third and fourth external electrodes 13 and 15 are disposed on the second element body 11.

If the protection circuit element is disposed on the second element body 11, the design flexibility related to the layout of the protection circuit element and the fourth external electrode 15 (the electrode portion 15a) is low. In other words, since the electrode portion 3a of the first external electrode 3 of the multilayer capacitor C1 is disposed on the first principal surface 1a opposing the third side surface 11a on which the electrode portion 15a is disposed, the protection circuit element needs to be disposed in a position where short circuit with the electrode portion 3a is avoided. In addition, since the protection circuit element and the fourth external electrode 15 need to be connected to each other, the protection circuit element and the fourth external electrode 15 cannot be freely laid out.

As described above, in the electronic component EC1, the protection circuit element is disposed in the second element body 11. Thus, in electronic component EC1, the design flexibility related to the layout of the protection circuit element and the fourth external electrode 15 is higher as compared with an electronic component employing a configuration in which the protection circuit element is disposed on the second element body 11.

When voltage is applied to the multilayer capacitor C1, mechanical strain arises in magnitude depending upon the applied voltage in the first element body 1 due to an electrostrictive effect. The mechanical strain generates electrostrictive vibration of the multilayer capacitor C1. When the multilayer capacitor C1 is mounted to the electronic device ED, and voltage is applied to the multilayer capacitor C1, electrostrictive vibration propagates to the electronic device ED. If the electrostrictive vibration propagates to the electronic device ED, the electronic device ED may vibrate, and vibration sound may be generated.

In the electronic component EC1, since the first metal terminal T1 includes the first leg portion 31, and the second metal terminal T2 includes the second leg portion 41, the first and second leg portions 31 and 41 absorb electrostrictive vibration. Thus, in the electronic component EC1, the propagation of electrostrictive vibration to the electronic device ED is suppressed. The generation of vibration sound is accordingly suppressed in the electronic device ED.

In the present embodiment, the first internal electrodes 7 and the electrode portion 3a of the first external electrode 3 are directly connected to each other. The protection circuit element (the fourth internal electrodes 19) and the electrode portion 15a of the fourth external electrode 15 are directly connected to each other. In this case, the connection resistance between the multilayer capacitor C1 and the overcurrent protection device CP1 is low. Thus, there is no possibility of disturbing the function of the overcurrent protection device CP1 (protection circuit element). As a result, overcurrent is prevented more surely from flowing between the first and second metal terminals T1 and T2.

In the present embodiment, the overcurrent protection device CP1 is a PTC thermistor, and includes the third and fourth internal electrodes 17 and 19 opposing each other. The third internal electrodes 17 are connected to the third external electrode 13, and the fourth internal electrodes 19 are connected to the fourth external electrode 15. If the short circuit of the multilayer capacitor C1 causes overcurrent to flow between the first and second metal terminals T1 and T2, resistance between the third and fourth internal electrodes 17 and 19 becomes higher. Thus, current is less likely to flow between the first and second metal terminals T1 and T2.

In the present embodiment, the second principal surface 1b of the multilayer capacitor C1 corresponds to a surface opposing the electronic device ED (mounting surface), and the multilayer capacitor C1 and the overcurrent protection device CP1 are disposed in such a manner that the first principal surface 1a and third side surface 11a oppose each other. Accordingly, in a state in which the electronic component EC1 is mounted on the electronic device ED, the overcurrent protection device CP1 is positioned above the multilayer capacitor C1 when viewed from the electronic device ED. Thus, the multilayer capacitor C1 and the overcurrent protection device CP1 are mounted to the electronic device ED without increasing a mounting area.

Figure 9:
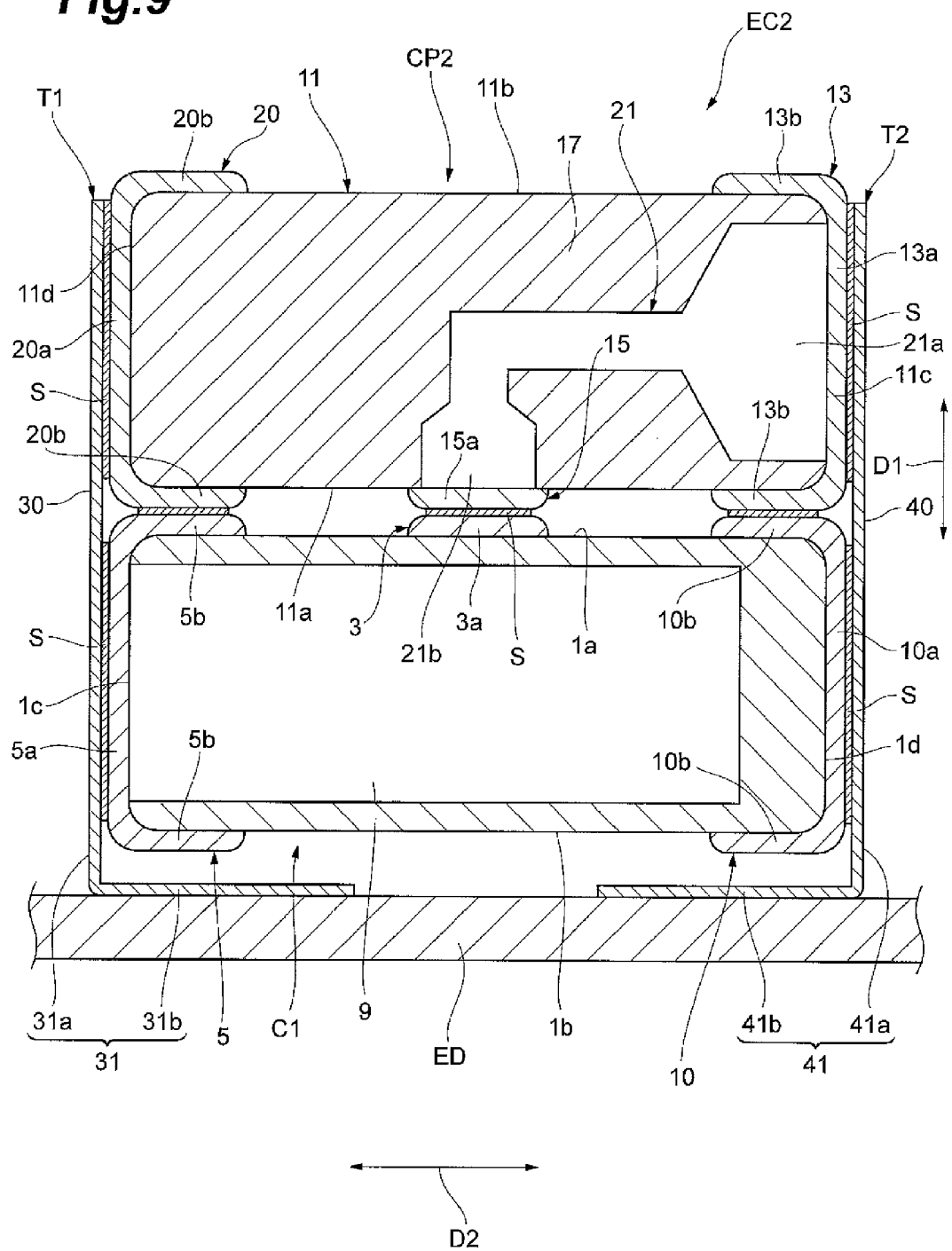
FIG. 9 is a diagram for illustrating a cross-sectional configuration of the electronic component according to the modified example.
Figure 10:
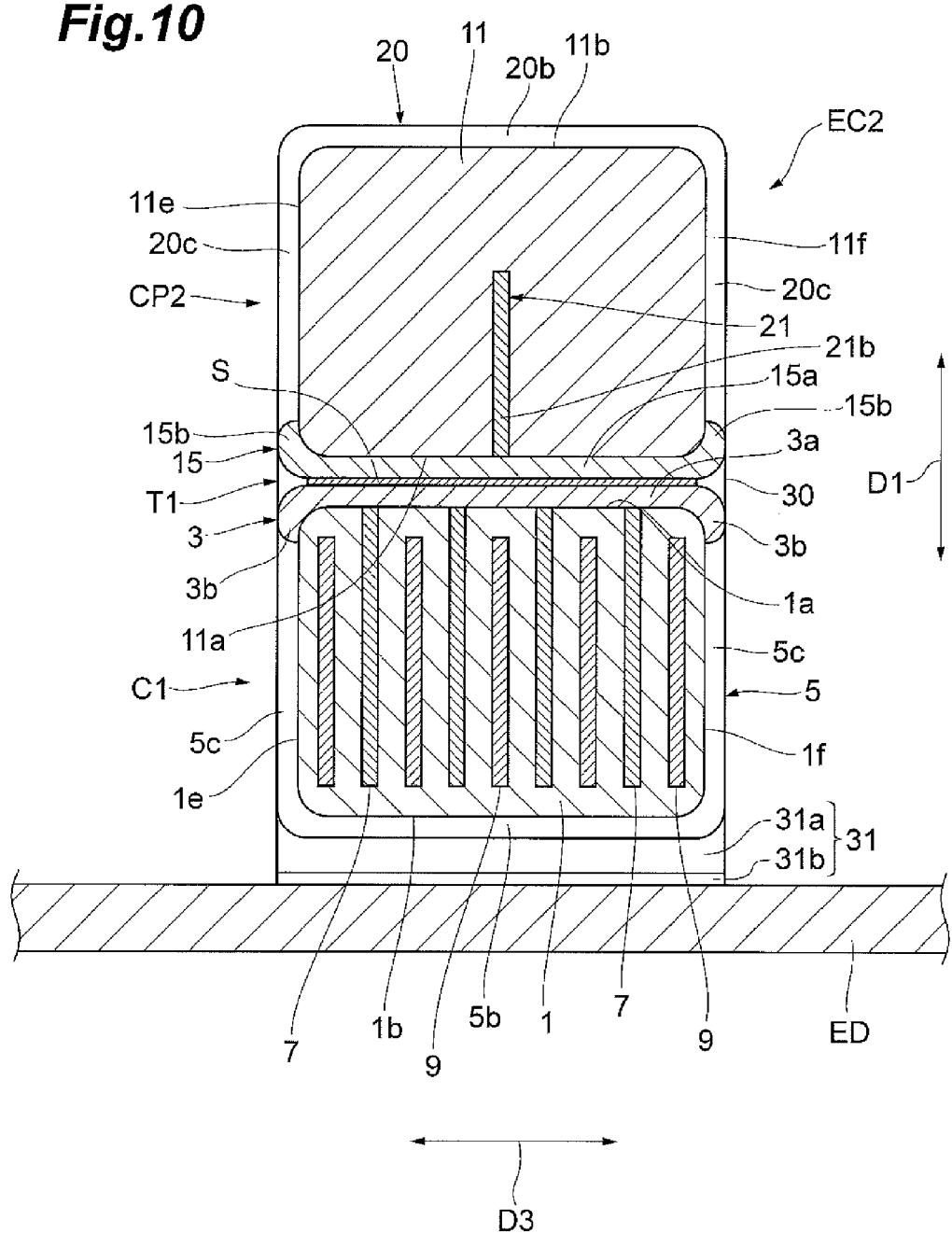
FIG. 10 is a diagram for illustrating a cross-sectional configuration of the electronic component according to the modified example.

Next, the configuration of an electronic component EC2 according to a modified example of the present embodiment will be described with reference to FIGS. 7 to 10. FIG. 7 is a perspective view illustrating the electronic component according to the modified example. FIG. 8 is a side view illustrating the electronic component according to the modified example. FIGS. 9 and 10 are diagrams for illustrating cross-sectional configurations of the electronic component according to the modified example. The modified example differs from the above-described embodiment in the configuration of an overcurrent protection device.

As illustrated in FIGS. 7 and 8, the electronic component EC2 includes the multilayer capacitor C1, an overcurrent protection device CP2, the first metal terminal T1, and the second metal terminal T2. Similarly to the above-described embodiment, the multilayer capacitor C1 includes the first element body 1, the first external electrode 3, the second external electrode 5, the plurality of first internal electrodes 7, and the plurality of second internal electrodes 9. The first external electrode 3 and the second external electrode 5 are disposed on the outer surfaces of the first element body 1. The plurality of first internal electrodes 7 and the plurality of second internal electrodes 9 are disposed in the first element body 1.

The overcurrent protection device CP2 includes the second element body 11, the third external electrode 13, and the fourth external electrode 15. The third external electrode 13 and the fourth external electrode 15 are disposed on the outer surfaces of the second element body 11. In the modified example, the overcurrent protection device CP2 is a fuse. The second element body 11 includes third and fourth side surfaces 11a and 11b opposing each other and each having a rectangular shape, third and fourth end surfaces 11c and 11d opposing each other, and fifth and sixth side surfaces 11e and 11f opposing each other. The third and fourth side surfaces 11a and 11b, the third and fourth end surfaces 11c and 11d, and the fifth and sixth side surfaces 11e and 11f constitute the outer surfaces of the second element body 11.

In the overcurrent protection device CP2, the second element body 11 includes a plurality of insulator layers stacked in a direction in which the fifth and sixth side surfaces 11e and 11f oppose each other. In the second element body 11 of the overcurrent protection device CP2, the stacking direction of the plurality of insulator layers corresponds to the third direction D3. Each insulator layer includes a sintered body of a ceramic green sheet containing insulator material. The insulator layers are so integrated that no boundary can be visually recognized between the insulator layers.

Similarly to the overcurrent protection device CP1, the overcurrent protection device CP2 also includes a protection circuit element disposed in the second element body 11. As illustrated in FIGS. 9 and 10, the overcurrent protection device CP2 includes an inner conductor 21. The inner conductor 21 constitutes the protection circuit element. The inner conductor 21 includes a first end portion 21a exposed to the third end surface 11c, and a second end portion 21b exposed to the third side surface 11a. The inner conductor 21 is made of soluble metal.

The first end portion 21a is connected to the third external electrode 13 (the electrode portion 13a). The electrode portion 13a thoroughly covers a portion of the first end portion 21a that is exposed to the third end surface 11c. The first end portion 21a is directly connected to the third external electrode 13. The second end portion 21b is connected to the fourth external electrode 15 (the electrode portion 15a). The electrode portion 15a thoroughly covers a portion of the second end portion 21b that is exposed to the third side surface 11a. The second end portion 21b is directly connected to the fourth external electrode 15. The third external electrode 13 and the fourth external electrode 15 are electrically connected to each other through the inner conductor 21.

The first metal terminal T1 is disposed to oppose the first end surface 1c of the multilayer capacitor C1 (the first element body 1) and the fourth end surface 11d of the overcurrent protection device CP2 (the second element body 11). The second metal terminal T2 is disposed to oppose the second end surface 1d of the multilayer capacitor C1 (the first element body 1) and the third end surface 11c of the overcurrent protection device CP2 (the second element body 11). The second metal terminal T2 opposes the first metal terminal T1 in such a manner as to sandwich the multilayer capacitor C1 and the overcurrent protection device CP2 between the second metal terminal T2 and the first metal terminal T1.

In the electronic component EC2, the multilayer capacitor C1 and the overcurrent protection device CP2 are disposed in such a manner that the first principal surface 1a and the third side surface 11a oppose each other. The electrode portion 3a disposed on the first principal surface 1a and the electrode portion 15a disposed on the third side surface 11a are connected to each other.

As described above, in the modified example, the first connection portion 30 of the first metal terminal T1 and the second external electrode 5 of the multilayer capacitor C1 are connected to each other. The second connection portion 40 of the second metal terminal T2 and the third external electrode 13 of the overcurrent protection device CP2 are connected to each other. The first external electrode 3 of the multilayer capacitor C1 and the fourth external electrode 15 of the overcurrent protection device CP2 are connected to each other. Thus, the multilayer capacitor C1 and the overcurrent protection device CP2 are connected in series between the first and second metal terminals T1 and T2. As a result, even if the multilayer capacitor C1 short-circuits, the overcurrent protection device CP2 prevents overcurrent from flowing between the first and second metal terminals T1 and T2.

In the modified example, the overcurrent protection device CP2 is a fuse, and includes the inner conductor 21. The first end portion 21a of the inner conductor 21 is connected to the third external electrode 13, and the second end portion 21b of the inner conductor 21 is connected to the fourth external electrode 15. If the short circuit of the multilayer capacitor C1 causes overcurrent to flow between the first and second metal terminals T1 and T2, the inner conductor 21 melts down. Thus, current does not flow between the first and second metal terminals T1 and T2.

The overcurrent protection device CP2 and the multilayer capacitor C1 are disposed in such a manner that the third side surface 11a opposes the first principal surface 1a of the multilayer capacitor C1. In the overcurrent protection device CP2, the protection circuit element (the inner conductor 21) is disposed in the second element body 11. The third and fourth external electrodes 13 and 15 are disposed on the second element body 11. Thus, in electronic component EC2, the design flexibility related to the layout of the protection circuit element and the fourth external electrode 15 is higher as compared with an electronic component employing a configuration in which the protection circuit element is disposed on the second element body 11.

Similarly to the above-described embodiment, also in the electronic component EC2, the first and second leg portions 31 and 41 absorb electrostrictive vibration, so that the propagation of electrostrictive vibration to the electronic device ED is suppressed. Thus, in the electronic device ED, the generation of vibration sound is suppressed.

In the modified example, the first internal electrodes 7 and the electrode portion 3a of the first external electrode 3 are directly connected to each other. The protection circuit element (the inner conductor 21) and the electrode portion 15a of the fourth external electrode 15 are directly connected to each other. In this case, the connection resistance between the multilayer capacitor C1 and the overcurrent protection device CP2 is low. Thus, there is no possibility of disturbing the function of the overcurrent protection device CP2 (protection circuit element). As a result, overcurrent is prevented more surely from flowing between the first and second metal terminals T1 and T2.

Also in the modified example, in a state in which the electronic component EC2 is mounted on the electronic device ED, the overcurrent protection device CP2 is positioned above the multilayer capacitor C1 when viewed from the electronic device ED. Thus, the multilayer capacitor C1 and the overcurrent protection device CP2 are mounted to the electronic device ED without increasing a mounting area.

Figure 11:
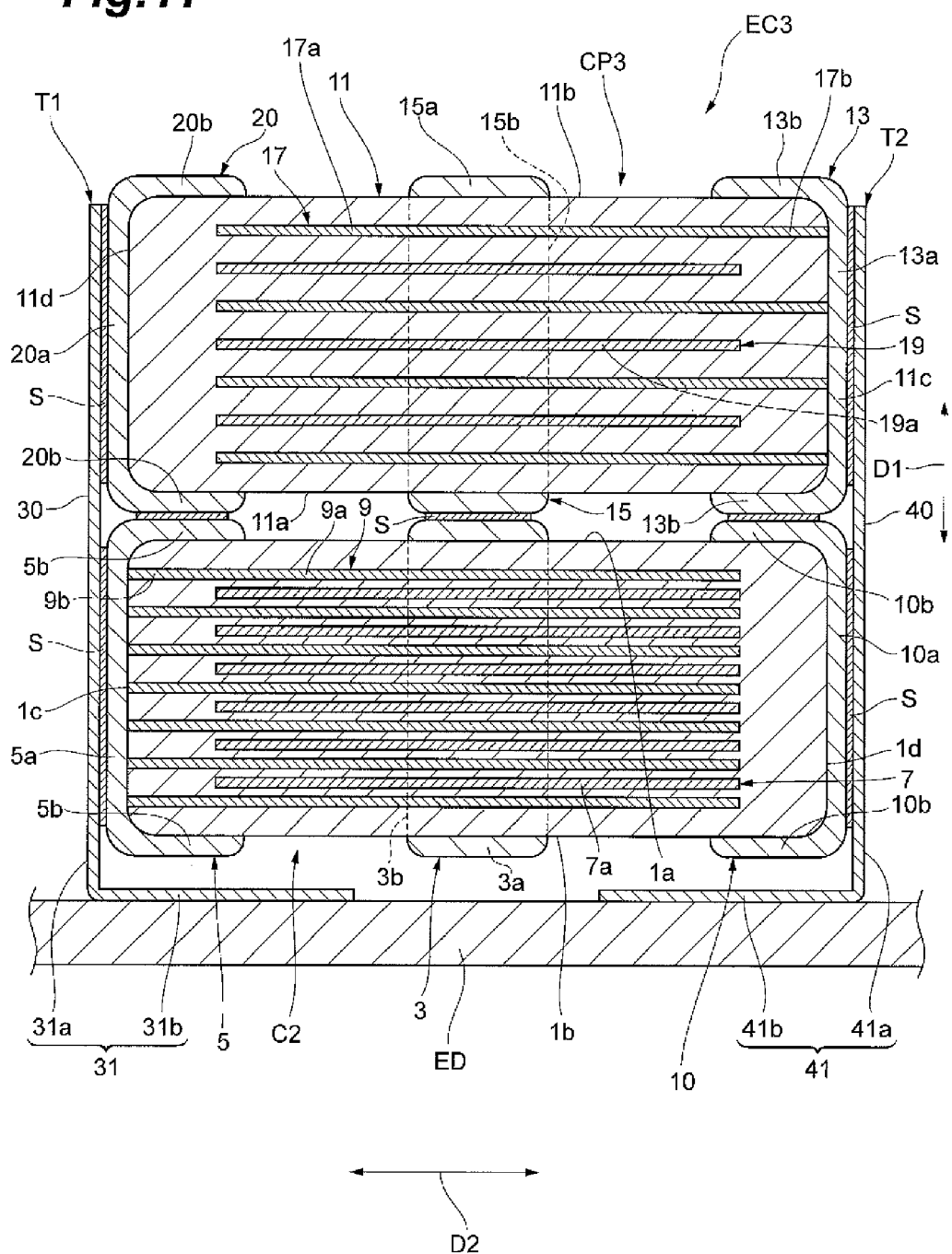
FIG. 11 is a diagram for illustrating a cross-sectional configuration of an electronic component according to another modified example of the present embodiment.
Figure 12:
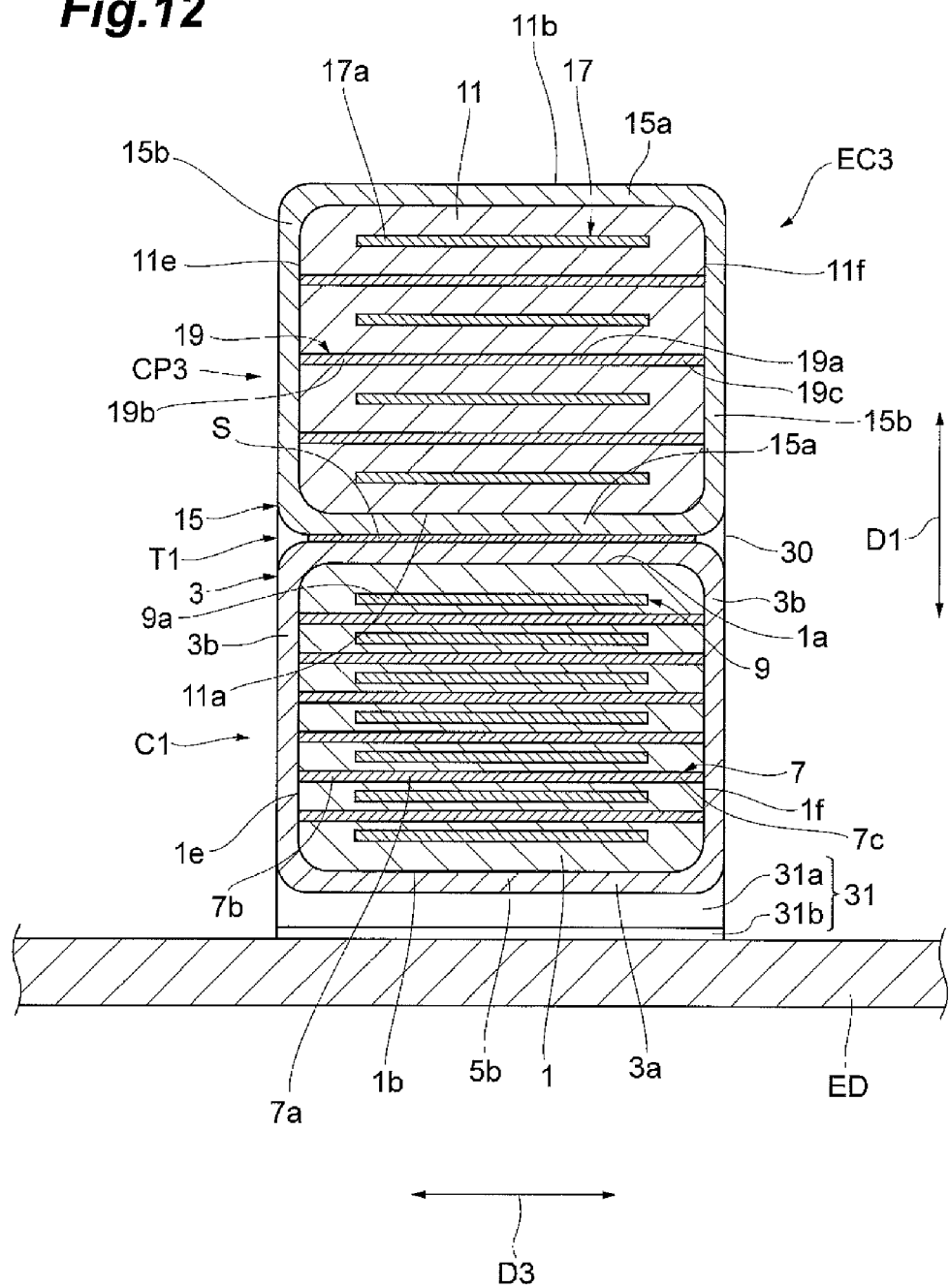
FIG. 12 is a diagram for illustrating a cross-sectional configuration of an electronic component according to another modified example of the present embodiment.

Next, the configuration of an electronic component EC3 according to a modified example of the present embodiment will be described with reference to FIGS. 11 and 12. FIGS. 11 and 12 are diagrams for illustrating cross-sectional configurations of the electronic component according to the modified example. The modified example differs from the above-described embodiment in the configurations of a multilayer capacitor and an overcurrent protection device.

As illustrated in FIGS. 11 and 12, the electronic component EC3 includes a multilayer capacitor C2, an overcurrent protection device CP3, the first metal terminal T1, and the second metal terminal T2. Similarly to the multilayer capacitor C1, the multilayer capacitor C2 includes the first element body 1, the first external electrode 3, the second external electrode 5, the plurality of first internal electrodes 7, and the plurality of second internal electrodes 9. The first external electrode 3 and the second external electrode 5 are disposed on the outer surfaces of the first element body 1. The plurality of first internal electrodes 7 and the plurality of second internal electrodes 9 are disposed in the first element body 1. Similarly to the overcurrent protection device CP1, the overcurrent protection device CP3 includes the second element body 11, the third external electrode 13, the fourth external electrode 15, the plurality of third internal electrodes 17, and the plurality of fourth internal electrodes 19. The third external electrode 13 and the fourth external electrode 15 are disposed on the outer surfaces of the second element body 11. The plurality of third internal electrodes 17 and the plurality of fourth internal electrodes 19 are disposed in the second element body 11.

In the multilayer capacitor C2, the first element body 1 includes a plurality of dielectric layers stacked in a direction in which the first and second principal surfaces 1a and 1b oppose each other (the first direction D1). The first internal electrodes 7 and the second internal electrodes 9 are disposed in positions (layers) different in the first direction D1. More specifically, the first internal electrodes 7 and the second internal electrodes 9 are alternately arranged in the first element body 1 to oppose each another with intervals in the first direction D1.

Each of the first internal electrodes 7 includes the main electrode portion 7a and a pair of connection portions 7b and 7c. The main electrode portion 7a has a rectangular shape with a long side direction corresponding to the second direction D2 and a short side direction corresponding to the third direction D3. The connection portion 7b extends from one side (one long side) of the main electrode portion 7a, and is exposed to the first side surface 1e. In other words, the connection portion 7b extends from an end portion on the first side surface 1e side of the main electrode portion 7a to the first side surface 1e. The connection portion 7c extends from one side (the other long side) of the main electrode portion 7a, and is exposed to the second side surface 1f. In other words, the connection portion 7c extends from an end portion on the second side surface 1f side of the main electrode portion 7a to the second side surface 1f.

The first internal electrode 7 extends in a direction orthogonal to the first and second side surfaces 1e and 1f (the third direction D3). The first internal electrode 7 is exposed to the first and second side surfaces 1e and 1f, and not exposed to the first and second principal surfaces 1a and 1b, and the first and second end surfaces 1c and 1d. The connection portion 7b is connected to the first external electrode 3 at the end portion exposed to the first side surface 1e. The connection portion 7c is connected to the first external electrode 3 at the end portion exposed to the second side surface 1f. The first internal electrode 7 is only required to include any one connection portion of the connection portions 7b and 7c.

Each of the second internal electrodes 9 includes the main electrode portion 9a and the connection portion 9b. The main electrode portion 9a has a rectangular shape with a long side direction corresponding to the second direction D2 and a short side direction corresponding to the third direction D3. The connection portion 9b extends from one side (one short side) of the main electrode portion 9a, and is exposed to the first end surface 1c. The second internal electrode 9 extends in a direction orthogonal to the first end surface 1c (the second direction D2). The connection portion 9b is connected to the second external electrode 5 at the end portion exposed to the first end surface 1c.

The first external electrode 3 includes electrode portions 3a disposed on the first and second principal surfaces 1a and 1b and electrode portions 3b disposed on the first and second side surfaces 1e and 1f. In other words, the first external electrode 3 is formed on the four surfaces 1a, 1b, 1e, and 1f. The electrode portions 3a and 3b adjacent to each other are electrically connected to each other at a ridge line portion of the first element body 1.

The electrode portion 3b disposed on the first side surface 1e thoroughly covers a portion of each of the connection portions 7b that is exposed to the first side surface 1e. The connection portion 7b is directly connected to the electrode portion 3b. The electrode portion 3b disposed on the second side surface 1f thoroughly covers a portion of each of the connection portions 7c that is exposed to the second side surface 1f. The connection portion 7c is directly connected to the electrode portion 3b. The connection portions 7b and 7c connect the main electrode portion 7a and the electrode portions 3b to each other. With this configuration, each of the first internal electrodes 7 is electrically connected to the first external electrode 3.

The second external electrode 5 includes an electrode portion 5a disposed on the first end surface 1c, electrode portions 5b disposed on the first and second principal surfaces 1a and 1b, and electrode portions 5c disposed on the first and second side surfaces 1e and 1f. The electrode portion 5a thoroughly covers a portion of each of the connection portions 9b that is exposed to the first end surface 1c. The connection portion 9b is directly connected to the second external electrode 5 (the electrode portion 5a). With this configuration, each of the second internal electrodes 9 is electrically connected to the second external electrode 5.

In the overcurrent protection device CP3, the second element body 11 includes a plurality of semiconductor layers stacked in a direction in which the third and fourth surfaces 11a and 11b oppose each other (the first direction D1). The third internal electrodes 17 and the fourth internal electrodes 19 are disposed in positions (layers) different in the first direction D1. More specifically, the third internal electrodes 17 and the fourth internal electrodes 19 are alternately arranged in the second element body 11 to oppose each another with intervals in the first direction D1.

Each of the third internal electrodes 17 includes the main electrode portion 17a and the connection portion 17b. The main electrode portion 17a has a rectangular shape with a long side direction corresponding to the second direction D2 and a short side direction corresponding to the third direction D3. The connection portion 17b extends from one side (one short side) of the main electrode portion 17a, and is exposed to the third end surface 11c. The third internal electrode 17 extends in a direction orthogonal to the third end surface 11c (the second direction D2). The connection portion 17b is connected to the third external electrode 13 at the end portion exposed to the third end surface 11c.

Each of the fourth internal electrodes 19 includes the main electrode portion 19a and a pair of connection portions 19b and 19c. The main electrode portion 19a has a rectangular shape with a long side direction corresponding to the second direction D2 and a short side direction corresponding to the third direction D3. The connection portion 19b of the fourth internal electrode 19 extends from one side (one long side) of the main electrode portion 19a, and is exposed to the fifth side surface 11e. The connection portion 19c of the fourth internal electrode 19 extends from one side (the other long side) of the main electrode portion 19a, and is exposed to the sixth side surface 11f.

The fourth internal electrode 19 extends in a direction orthogonal to the fifth and sixth side surfaces 11e and 11f (the third direction D3). The fourth internal electrode 19 is exposed to the fifth and sixth side surfaces 11e and 11f, and not exposed to the third and fourth end surfaces 11c and 11d, and the third and fourth side surfaces 11a and 11b. The connection portion 19b is connected to the fourth external electrode 15 at the end portion exposed to the fifth side surface 11e. The connection portion 19c is connected to the fourth external electrode 15 at the end portion exposed to the sixth side surface 11f. The fourth internal electrode 19 is only required to include any one connection portion of the connection portions 19b and 19c.

The third external electrode 13 includes the electrode portion 13a disposed on the third end surface 11c, the electrode portions 13b disposed on the third and fourth side surfaces 11a and 11b, and the electrode portions 13c disposed on the fifth and sixth side surfaces 11e and 11f. The electrode portion 13a thoroughly covers a portion of each of the connection portions 17b that is exposed to the third end surface 11c. The connection portion 17b is directly connected to the third external electrode 13 (the electrode portion 13a). Each of the third internal electrodes 17 is electrically connected to the third external electrode 13.

The fourth external electrode 15 includes the electrode portions 15a disposed on the third and fourth side surface 11a and 11b, and the electrode portions 15b disposed on the fifth and sixth side surfaces 11e and 11f. In other words, the fourth external electrode 15 is formed on the four surfaces 11a, 11b, 11e, and 11f. The electrode portions 15a and 15b adjacent to each other are electrically connected to each other at an edge line portion of the second element body 11.

The electrode portion 15b disposed on the fifth side surface 11e thoroughly covers a portion of each of the connection portions 19b that is exposed to the fifth side surface 11e. The connection portion 19b is directly connected to the electrode portion 15b. The electrode portion 15b disposed on the sixth side surface 11f thoroughly covers a portion of each of the connection portions 19c that is exposed to the sixth side surface 11f. The connection portion 19c is directly connected to the electrode portion 15b. The connection portions 19b and 19c connect the main electrode portion 17a and the electrode portions 15b to each other. Each of the fourth internal electrodes 19 is electrically connected to the fourth external electrode 15.

In the electronic component EC3, the multilayer capacitor C2 and the overcurrent protection device CP3 are disposed in such a manner that the first principal surface 1a and the third side surface 11a oppose each other. The electrode portion 3a disposed on the first principal surface 1a and the electrode portion 15a disposed on the third side surface 11a are connected to each other. The electrode portions 3a and 15a are connected to each other by, for example, the solder S. In the modified example, the first internal electrodes 7 are electrically connected to the fourth external electrode 15 of the overcurrent protection device CP3 through the electrode portions 3b and 3a.

Similarly to the above-described embodiment, also in the modified example, the multilayer capacitor C2 and the overcurrent protection device CP3 are connected in series between the first and second metal terminals T1 and T2. As a result, even if the multilayer capacitor C2 short-circuits, the overcurrent protection device CP3 prevents overcurrent from flowing between the first and second metal terminals T1 and T2. Similarly to the above-described embodiment, also in the electronic component EC3, the first and second leg portions 31 and 41 absorb electrostrictive vibration, so that the propagation of electrostrictive vibration to the electronic device ED is suppressed. Thus, in the electronic device ED, the generation of vibration sound is suppressed.

Figure 13:
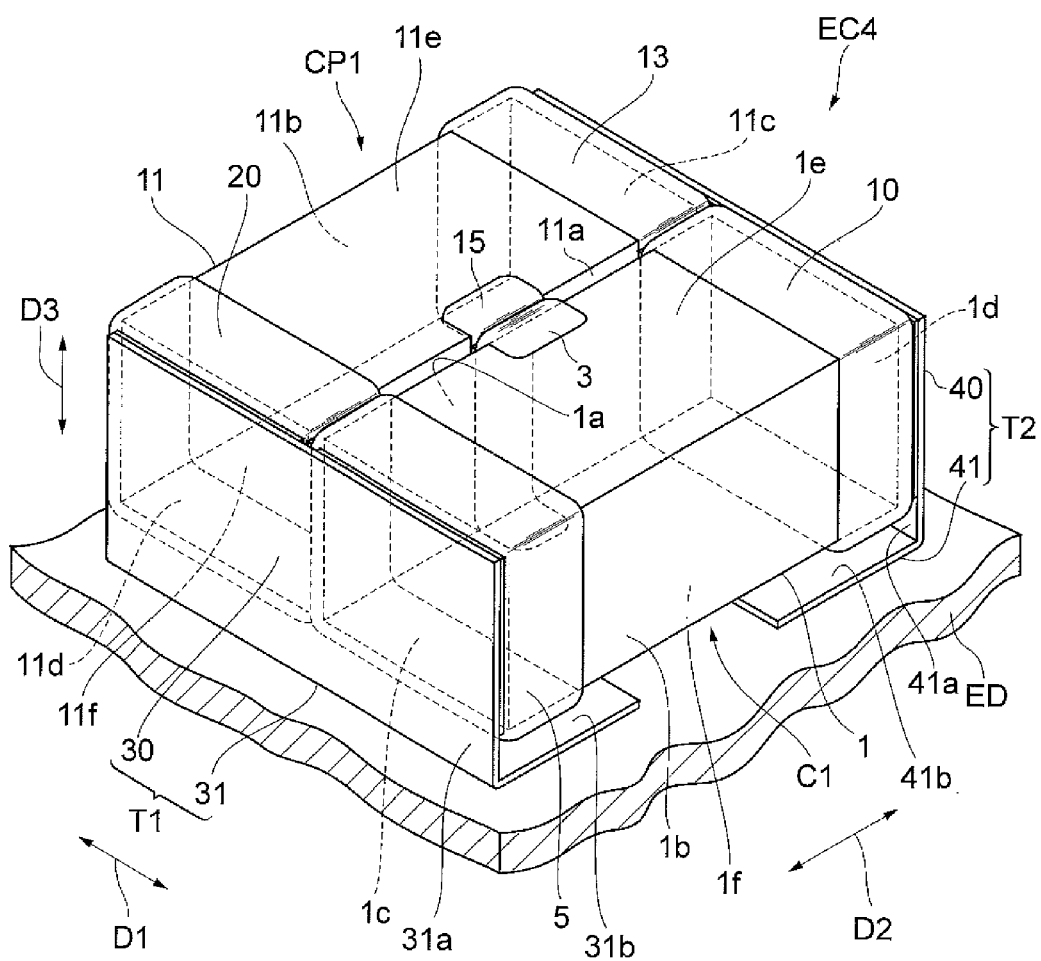
FIG. 13 is a perspective view illustrating an electronic component according to another modified example of the present embodiment.

Next, the configuration of an electronic component EC4 according to a modified example of the present embodiment will be described with reference to FIG. 13. FIG. 13 is a perspective view illustrating the electronic component according to the modified example.

As illustrated in FIG. 13, the electronic component EC4 includes the multilayer capacitor C1, the overcurrent protection device CP1, the first metal terminal T1, and the second metal terminal T2.

The first metal terminal T1 includes the first connection portion 30 and the first leg portion 31. The first connection portion 30 extends in the first direction D1, and has a rectangular shape when viewed from the second direction D2. The first leg portion 31 extends from one end of the first connection portion 30. The first leg portion 31 includes the first portion 31a and the second portion 31b. The first portion 31a extends in the third direction D3 from one end of the first connection portion 30. The first connection portion 30 and the first portion 31a are positioned on the same plane.

The second portion 31b extends in the second direction D2 from one end of the first portion 31a, and has a rectangular shape when viewed from the third direction D3. The first portion 31a and the second portion 31b extend in the respective directions intersecting with each other. The first portion 31a extends in the third direction D3 to connect one end of the first connection portion 30 and one end of the second portion 31b to each other. When viewed in the third direction D3, the first connection portion 30 and the second portion 31b are separated from each other by the length of the first portion 31a.

The second metal terminal T2 includes the second connection portion 40 and the second leg portion 41. The second connection portion 40 extends in the first direction D1, and has a rectangular shape when viewed from the second direction D2. The second leg portion 41 extends from one end of the second connection portion 40. The second leg portion 41 includes the third portion 41a and the fourth portion 41b. The third portion 41a extends in the third direction D3 from one end of the second connection portion 40. The second connection portion 40 and the third portion 41a are positioned on the same plane.

The fourth portion 41b extends in the second direction D2 from one end of the third portion 41a, and has a rectangular shape when viewed from the third direction D3. The third portion 41a and the fourth portion 41b extend in the respective directions intersecting with each other. The third portion 41a extends in the third direction D3 to connect one end of the second connection portion 40 and one end of the fourth portion 41b to each other. When viewed in the third direction D3, the second connection portion 40 and the fourth portion 41b are separated from each other by the length of the third portion 41a.

The electronic component EC4 is mounted on the electronic device ED in a state in which the first side surface 1e of the multilayer capacitor C1 and the fifth side surface 11e of the overcurrent protection device CP1 oppose the electronic device ED. In other words, the electronic component EC4 is mounted in such a manner that the third direction D3 intersects with the electronic device ED. For example, the electronic component EC4 is solder-mounted on the electronic device ED. In a state in which the electronic component EC4 is mounted on the electronic device ED, the multilayer capacitor C1 is separated from the electronic device ED in the third direction D3.

Also in the modified example, even if the multilayer capacitor C1 short-circuits, the overcurrent protection device CP1 prevents overcurrent from flowing between the first and second metal terminals T1 and T2. In the electronic component EC4, the first and second leg portions 31 and 41 absorb electrostrictive vibration, so that the propagation of electrostrictive vibration to the electronic device ED is suppressed. Thus, in the electronic device ED, the generation of vibration sound is suppressed.

The embodiment of the present invention has been described above. The present invention, however, is not necessarily limited to the above-described embodiment, and various changes can be made without departing from the scope of the present invention.

The multilayer capacitors C1 and C2 may not include the connection conductor 10. In this case, the second metal terminal T2 is connected only to the third external electrode 13. The overcurrent protection devices CP1 and CP2 may not include the connection conductor 20, either. In this case, the first metal terminal T1 is connected only to the second external electrode 5. In the overcurrent protection devices CP1 and CP2, the second element body 11 may have a circular cylindrical shape. In this case, the cylindrical surface of the second element body 11 serves as the third side surface.

The second element body 11 of the overcurrent protection device CP2 may be a hollow member. More specifically, the second element body 11 of the overcurrent protection device CP2 may include an internal space for storing an inner circuit element (the inner conductor 21). The inner circuit element and the third and fourth external electrodes 13 and 15 may be integrally formed. More specifically, the inner circuit element and the third and fourth external electrodes 13 and 15 may be integrally formed so that the inner circuit element and the third and fourth external electrodes 13 and 15 are connected to each other.

In the overcurrent protection device CP2, the second element body 11 may include a plurality of semiconductor layers stacked in a direction in which the third and fourth side surfaces 11a and 11b oppose each other (the first direction D1). In this case, the inner conductor 21 includes the first end portion 21a exposed to the third end surface 11c, and the second end portion 21b exposed to the fifth side surface 11e. The electrode portion 15b of the fourth external electrode 15 thoroughly covers a portion of the second end portion 21b that is exposed to the fifth side surface 11e. The second end portion 21b is directly connected to the fourth external electrode 15.

In the electronic component EC1, EC2, or EC3, the fourth side surface 11b of the overcurrent protection device CP1, CP2, or CP3 may correspond to a surface opposing the electronic device ED (mounting surface). In other words, in a state in which the electronic component EC1, EC2, or EC3 is mounted on the electronic device ED, the multilayer capacitor C1 or C2 may be positioned above the overcurrent protection device CP1, CP2, or CP3 when viewed from the electronic device ED.

The electronic component EC1 may include an overcurrent protection device CP3 in place of the overcurrent protection device CP1. The electronic component EC3 may include the multilayer capacitor C1 in place of the multilayer capacitor C2. The electronic component EC4 may include the overcurrent protection device CP2 in place of the overcurrent protection device CP1. The electronic component EC4 may include the multilayer capacitor C2 in place of the multilayer capacitor C1.

What is claimed is:

1. An electronic component comprising:
a multilayer capacitor;
an overcurrent protection device;
a first metal terminal; and
a second metal terminal,
wherein the multilayer capacitor includes:
a first element body including first and second principal surfaces opposing each other in a first direction, first and second end surfaces opposing each other in a second direction orthogonal to the first direction, and first and second side surfaces opposing each other in a third direction orthogonal to the first and second directions, and having a rectangular parallelepiped shape;
first and second internal electrodes disposed in the first element body to oppose each other; and
a first external electrode including an electrode portion disposed on the first principal surface, and to which the first internal electrode is connected;
a second external electrode including an electrode portion disposed on the first end surface, and to which the second internal electrode is connected;
wherein the overcurrent protection device includes:
a second element body including third and fourth end surfaces opposing each other in the second direction, and a third side surface connecting the third and fourth end surfaces;
a protection circuit element disposed in the second element body;
a third external electrode including an electrode portion disposed on the third end surface, and to which the protection circuit element is connected; and
a fourth external electrode including an electrode portion disposed on the third side surface, and to which the protection circuit element is connected,
wherein the first metal terminal includes a first connection portion connected to the electrode portion of the second external electrode, and a first leg portion extending from the first connection portion,
wherein the second metal terminal includes a second connection portion connected to the electrode portion of the third external electrode, and a second leg portion extending from the second connection portion,
wherein the multilayer capacitor and the overcurrent protection device are disposed in such a manner that the first principal surface and the third side surface oppose each other, and
wherein the electrode portion of the first external electrode and the electrode portion of the fourth external electrode are connected to each other.

2. The electronic component according to claim 1,
wherein the first internal electrode and the electrode portion of the first external electrode are connected to each other, and
wherein the protection circuit element and the electrode portion of the fourth external electrode are connected to each other.

3. The electronic component according to claim 1,
wherein the overcurrent protection device is a PTC thermistor, and includes at least one pair of internal electrodes opposing each other, as the protection circuit element, and
wherein one of the internal electrodes is connected to the third external electrode, and
wherein another one of the internal electrodes is connected to the fourth external electrode.

4. The electronic component according to claim 1,
wherein the overcurrent protection device is a fuse, and includes an inner conductor made of soluble metal, as the protection circuit element,
wherein one end portion of the inner conductor is connected to the third external electrode, and
wherein another end portion of the inner conductor is connected to the fourth external electrode.

* * * * *